US012452986B2

(12) United States Patent
Vaschenko et al.

(10) Patent No.: US 12,452,986 B2
(45) Date of Patent: Oct. 21, 2025

(54) NOZZLE APPARATUS

(71) Applicant: ASML Netherlands B.V., Veldhoven (NL)

(72) Inventors: Georgiy Olegovich Vaschenko, San Diego, CA (US); Bob Rollinger, San Diego, CA (US); Joshua Mark Lukens, San Diego, CA (US); Alexander Igorevich Ershov, Escondido, CA (US); Yoshiho Amada, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 380 days.

(21) Appl. No.: 17/637,654

(22) PCT Filed: Sep. 4, 2020

(86) PCT No.: PCT/EP2020/074874
§ 371 (c)(1),
(2) Date: Feb. 23, 2022

(87) PCT Pub. No.: WO2021/044037
PCT Pub. Date: Mar. 11, 2021

(65) Prior Publication Data
US 2022/0295625 A1    Sep. 15, 2022

Related U.S. Application Data

(60) Provisional application No. 62/897,082, filed on Sep. 6, 2019, provisional application No. 62/988,579, filed on Mar. 12, 2020.

(51) Int. Cl.
*H05G 2/00*    (2006.01)
(52) U.S. Cl.
CPC ................ *H05G 2/0023* (2024.08)

(58) Field of Classification Search
None
See application file for complete search history.

(56) References Cited

U.S. PATENT DOCUMENTS

| 6,419,752 | B1 | 7/2002 | Shvets et al. |
| 9,527,106 | B2 | 12/2016 | Ngu et al. |
| (Continued) | | | |

FOREIGN PATENT DOCUMENTS

| CN | 104590759 A | 5/2015 |
| CN | 108432349 A | 8/2018 |
| (Continued) | | |

OTHER PUBLICATIONS

Jan Krauss, European International Searching Authority, International Search Report and Written Opinion, counterpart PCT Application No. PCT/EP2020/074874, mailed Nov. 18, 2020, 21 pages total.

(Continued)

*Primary Examiner* — Eliza W Osenbaugh-Stewart
(74) *Attorney, Agent, or Firm* — DiBerardino McGovern IP Group LLC

(57) ABSTRACT

An apparatus includes: a tube; a body including: a first body wall and a second body wall; and a support structure including: a first support portion and a second support portion. The first body wall extends in a first direction, the second body wall extends in a second direction that is different than the first direction, a first portion of the tube passes through an opening in the second body wall the first support portion is configured to attach to the first body wall, and a second portion of the tube is configured to pass through the second support portion when the first support portion is attached to the first body wall. An interior of the tube and an interior of the body are configured to receive (Continued)

molten target material, and the target material emits extreme ultraviolet (EUV) light when in a plasma state.

21 Claims, 16 Drawing Sheets

(56) References Cited

U.S. PATENT DOCUMENTS

| | | | |
|---|---|---|---|
| 2004/0114720 | A1 | 6/2004 | Orsini et al. |
| 2008/0191051 | A1 | 8/2008 | Faubel et al. |
| 2009/0014668 | A1 | 1/2009 | Vaschenko |
| 2009/0230326 | A1* | 9/2009 | Vaschenko ............. H05G 2/008 250/492.2 |
| 2013/0146682 | A1 | 6/2013 | Ishihara et al. |
| 2015/0293456 | A1* | 10/2015 | Dijksman ............. H05G 2/006 239/102.1 |
| 2016/0227638 | A1 | 8/2016 | Hori et al. |
| 2017/0048956 | A1 | 2/2017 | Lee et al. |

FOREIGN PATENT DOCUMENTS

| | | |
|---|---|---|
| CN | 109379827 A | 2/2019 |
| JP | 2005268461 A | 9/2005 |
| JP | 6057221 B2 | 1/2017 |
| TW | 200944061 A | 10/2009 |
| TW | 201131316 A | 9/2011 |
| TW | 201313073 A | 3/2013 |
| TW | 201337474 A | 9/2013 |
| TW | 201732453 A | 9/2017 |
| TW | 201812478 A | 4/2018 |
| WO | 2011082891 A1 | 7/2011 |
| WO | 2012136343 A1 | 10/2012 |
| WO | 2013020758 A1 | 2/2013 |
| WO | 201313706 A1 | 9/2013 |
| WO | 2014082811 A1 | 6/2014 |
| WO | 2015101509 A1 | 7/2015 |
| WO | 2017083569 A1 | 5/2017 |
| WO | 2017102931 A1 | 6/2017 |
| WO | 2018041599 A1 | 3/2018 |

OTHER PUBLICATIONS

"Die Venöse Und Die Kapilläre Blutabnahme Butterfly Nadel-Adapter-System," available at https://www.labors.at/wp-content-uploads/2017/06Blutabnahme-Broschre-Labors.at-V4-13.6.2017.pdf (2017).

* cited by examiner

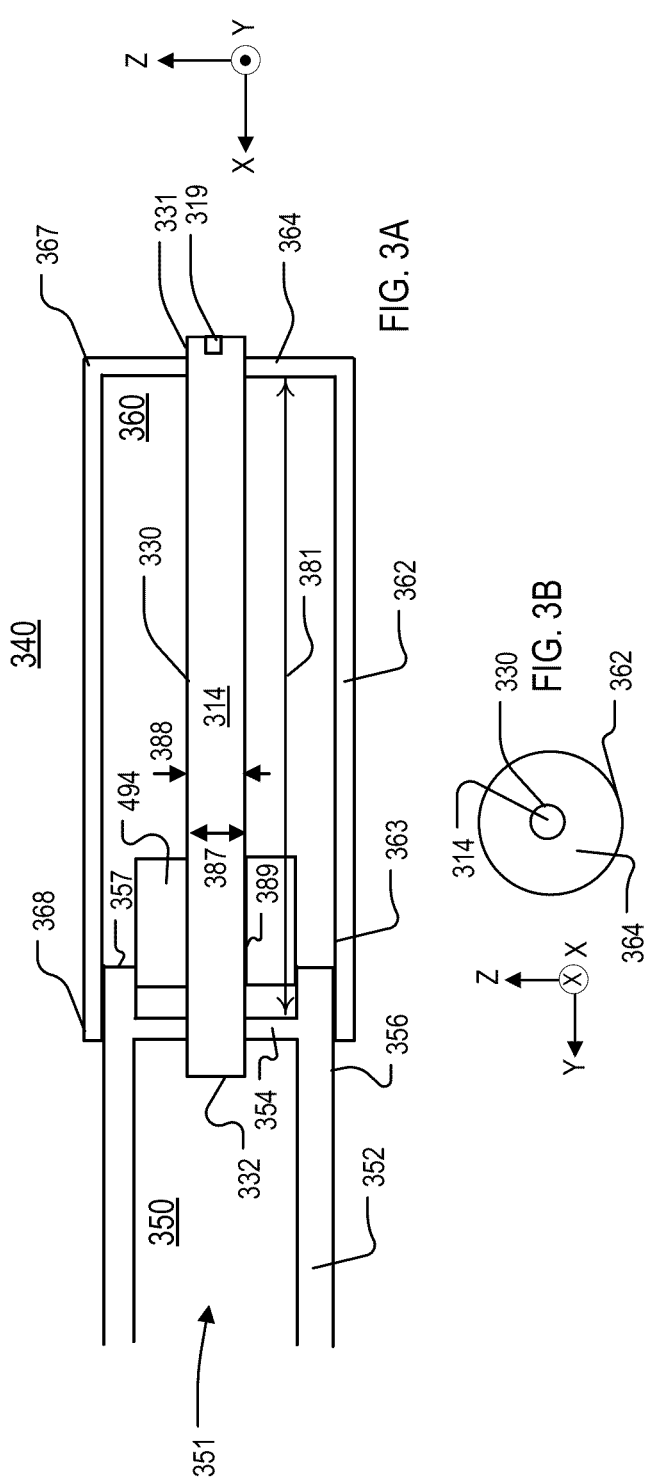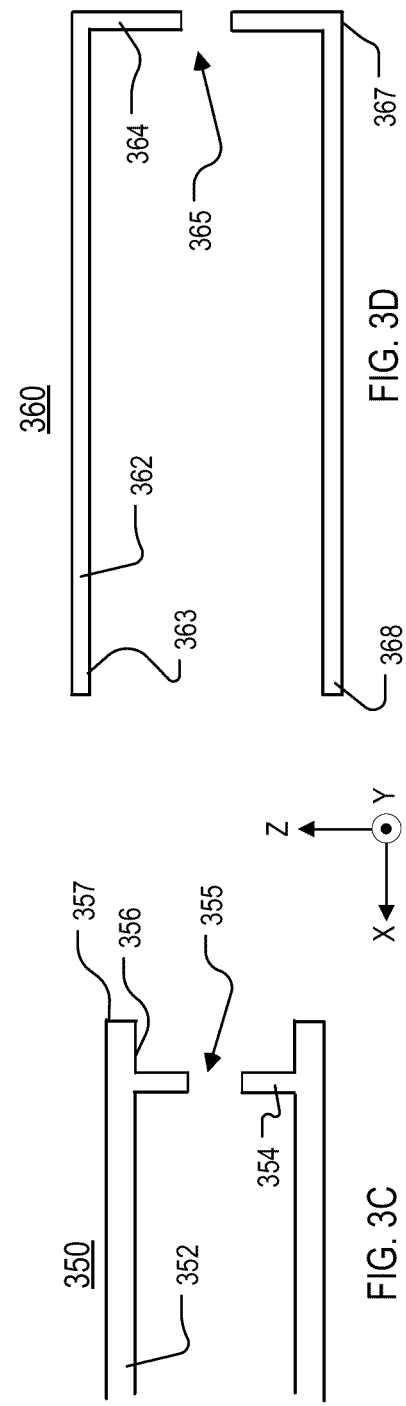

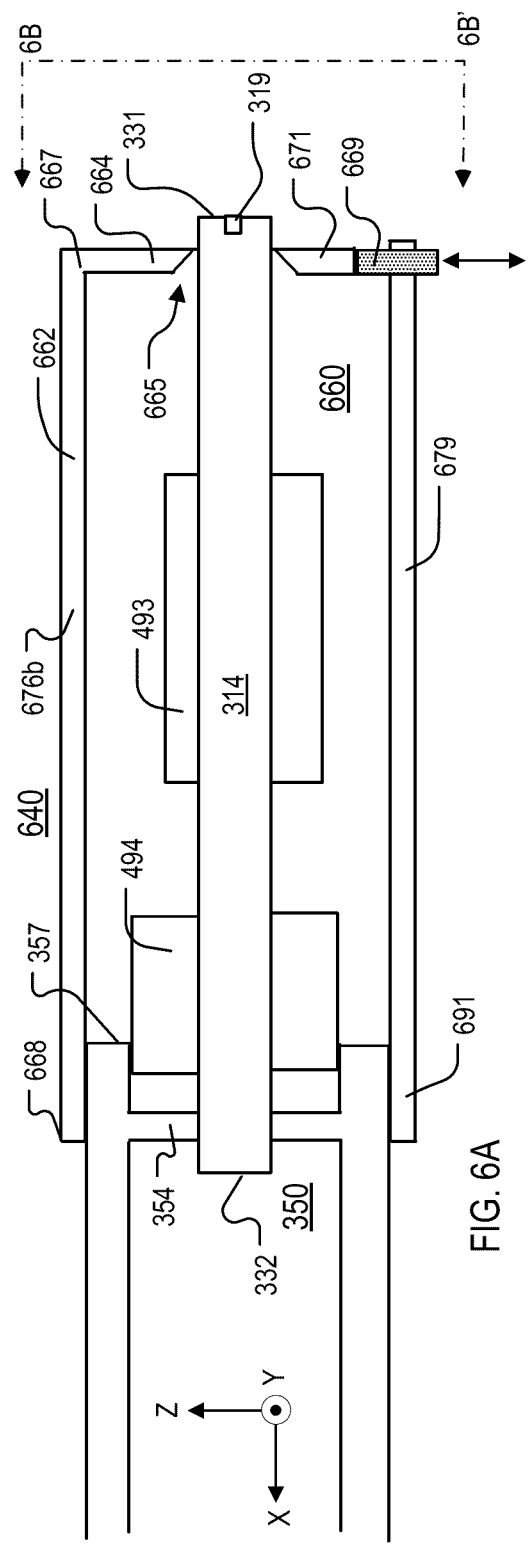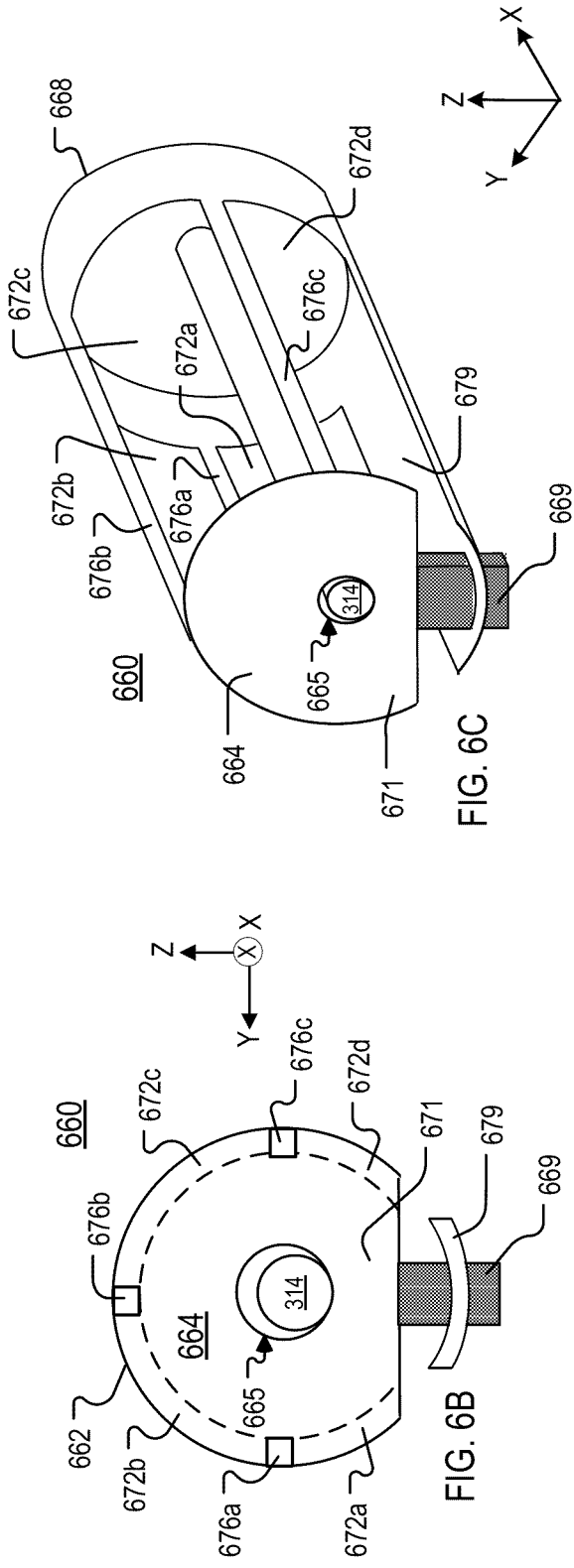
FIG. 6A
FIG. 6B
FIG. 6C

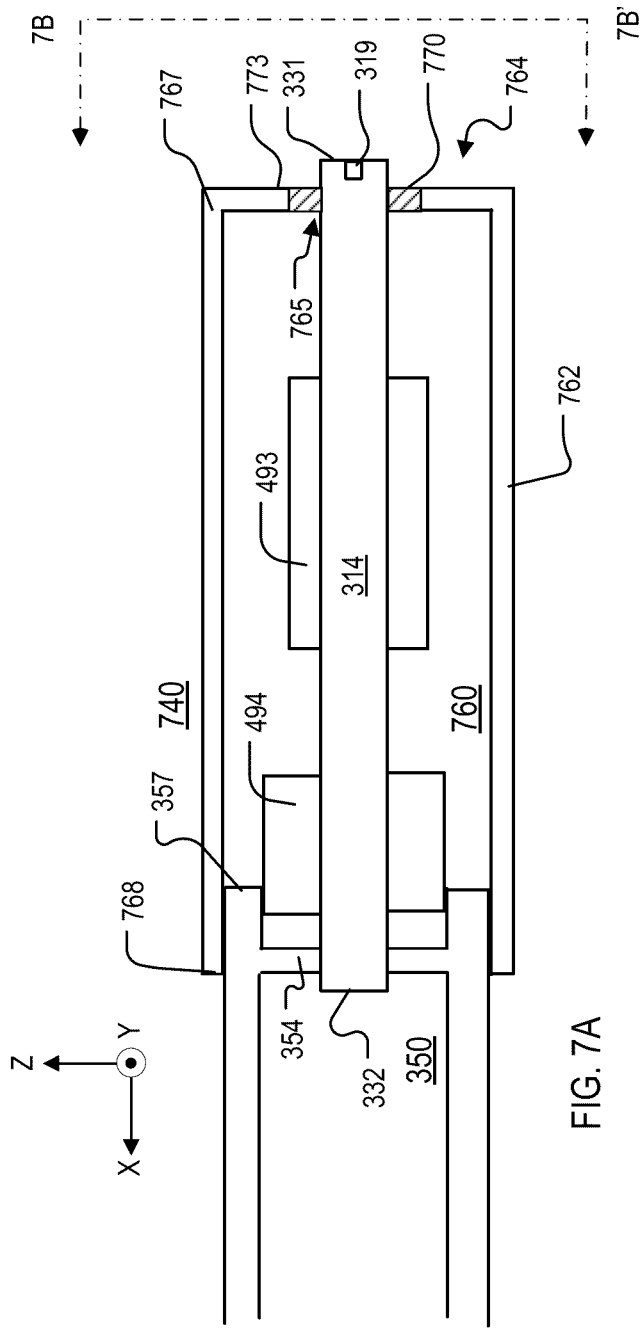
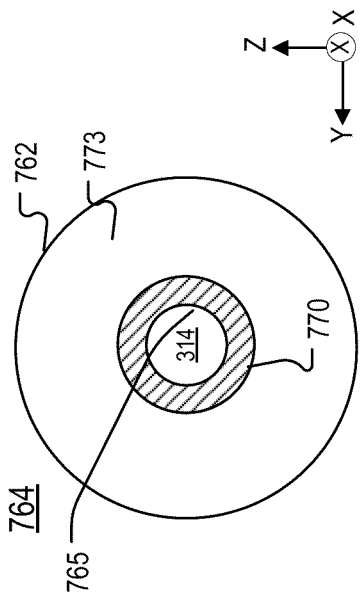
FIG. 7A
FIG. 7B

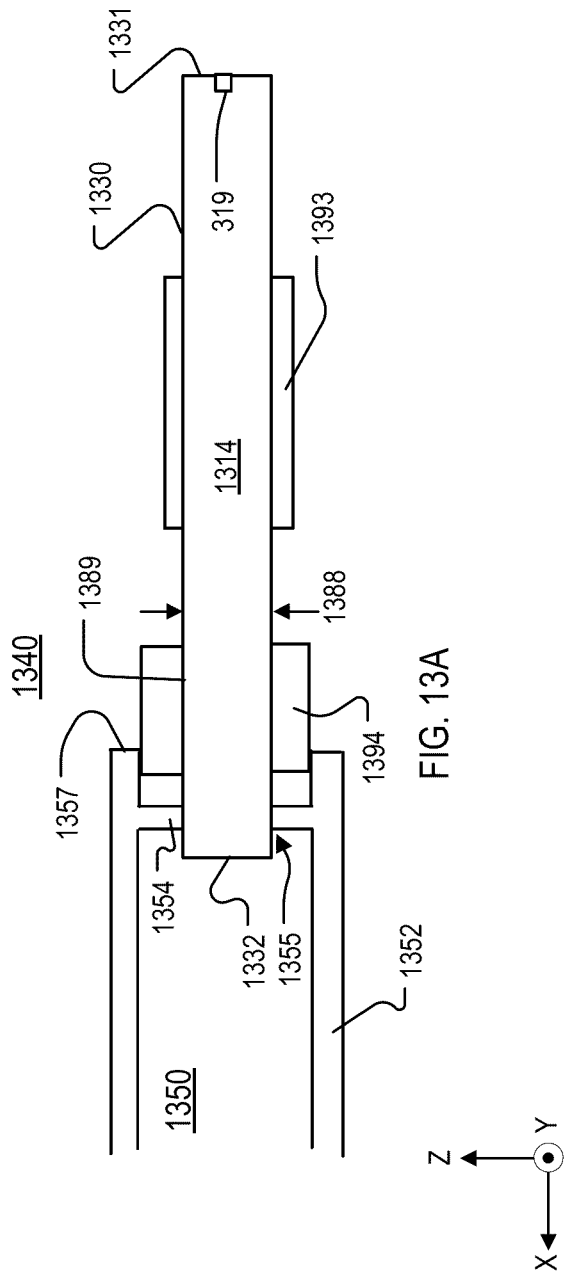
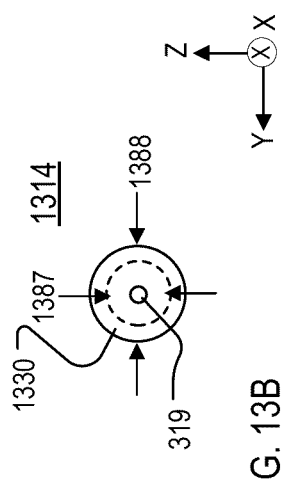
FIG. 13A
FIG. 13B

NOZZLE APPARATUS

CROSS REFERENCE TO RELATED APPLICATIONS

This application claims priority to U.S. Application No. 62/897,082, filed Sep. 6, 2019 and titled NOZZLE APPARATUS, and U.S. Application No. 62/988,579, filed Mar. 12, 2020 and titled NOZZLE APPARATUS, both of which are incorporated herein in their entireties by reference.

TECHNICAL FIELD

This disclosure relates to a nozzle apparatus. The nozzle apparatus may be used to generate targets in an extreme ultraviolet (EUV) light source.

BACKGROUND

A nozzle apparatus may be used to produce a stream or jet of fluid material. For example, the nozzle apparatus may be used to produce targets that are converted to plasma that emits extreme ultraviolet (EUV) light.

EUV light may be, for example, electromagnetic radiation having wavelengths of 100 nanometers (nm) or less (also sometimes referred to as soft x-rays), and including light at a wavelength of, for example, 20 nm or less, between 5 and 20 nm, or between 13 and 14 nm, may be used in photolithography processes to produce extremely small features in substrates, for example, silicon wafers, by initiating polymerization in a resist layer. Methods to produce EUV light include, but are not necessarily limited to, converting a material that includes an element, for example, xenon, lithium, or tin, with an emission line in the EUV range in a plasma state. In one such method, often termed laser produced plasma (LPP), the required plasma may be produced by irradiating a target material, for example, in the form of a droplet, plate, tape, stream, or cluster of material, with an amplified light beam that may be referred to as a drive laser. For this process, the plasma is typically produced in a sealed vessel, for example, a vacuum chamber, and monitored using various types of metrology equipment.

SUMMARY

In one aspect, an apparatus includes: a tube having an inner width, and an opening at an end, the inner width being between 0.1 millimeters (mm) and 0.8 mm, and the opening having a width between 1.0 micrometer (μm) and 5 μm; an electro-mechanical actuator in contact with the tube and configured to impart mechanical motion into the tube, the mechanical motion including at least a first frequency component between 40 kilohertz (kHz) and 100 kHz and a second frequency component having a higher frequency than the first frequency component; a body including: a first body wall and a second body wall; and a support structure including: a first support portion and a second support portion. The first body wall extends in a first direction, the second body wall extends in a second direction that is different than the first direction, a first portion the tube passes through an opening in the second body wall, the first support portion is configured to attach to the first body wall, and a second portion of the tube is configured to pass through the second support portion when the first support portion is attached to the first body wall. An interior of the tube and an interior of the body are configured to receive molten target material, and the target material emits extreme ultraviolet (EUV) light when in a plasma state.

Implementations may include one or more of the following features. The second support portion may include an end wall that defines a support opening, and the second portion of the tube may be configured to pass through the support opening when the first support portion is attached to the first body wall. The support opening may include a chamfered opening, and, in these implementations, when the first support portion is attached to the first body wall, an exterior surface of the second portion of the tube is captured by the chamfered opening. The second support portion also may include an adjustment mechanism configured to control a mechanical coupling between the tube and the second support portion. The first support portion may extend from a first end that is configured to attach to the first body wall, and the first support portion may include a plurality of segments that extend from the first end. The plurality of segments may include a rigid prong and at least one flexible prong. The adjustment mechanism may pass through the rigid prong, and the adjustment mechanism may be configured to position the second support portion to thereby control mechanical coupling between the tube and the second support portion. An opening may be between each of the plurality of segments. The adjustment mechanism may be in physical contact with the first support portion and the end wall, and the adjustment mechanism may be configured to move the end wall to control the mechanical coupling between the tube and the second support. The end wall may include a first material, and the apparatus also may include a ferrule of a second material that surrounds the support opening, and the second material may be softer than the first material. The first material may include a metal, and the second material may include a polymer. The polymer may be polyimide resin, polyetheretherketone, polybenzimidazole resin, or Teflon. The first material may include a metal, and the second material may include an adhesive material. The adhesive material may be bismaleimide resin or cyanate ester based resin.

The apparatus also may include a potting compound, and, in these implementations, when the first support portion is attached to the first body wall, the first support portion and the end wall define an interior support region that contains the potting compound. In some implementations, the potting compound does not completely fill the interior support region. The potting compound may occupy a first part of the interior support region that is closer to the body than to the end wall, while a second part of the interior support region that is closer to the end wall than the body lacks any potting compound. The potting compound may be an adhesive. The adhesive may be at least one of a bismaleimide-based adhesive, a benzoxazine-based adhesive, a cyanate ester based adhesive, a room-temperature-vulcanizing (RTV) adhesive, or a high temperature epoxy adhesive. In some implementations, the tube passes through the support opening in the second support portion, and the tube does not make mechanical contact with the second support portion. In these implementations, the second support portion is configured to protect the potting material from plasma emitted when the target material is in a plasma state.

The first support portion may be a rigid material. The first support portion may include a metal. The first support portion may include a flexible material.

The support structure may be between the body and the electro-mechanical actuator.

In some implementations, when the first support portion is attached to the first body wall, the electro-mechanical actuator may be surrounded by the first support portion.

The first support portion may be configured to attach to an exterior of the first body wall.

The second frequency component may be a harmonic of the first frequency component or a harmonic of another frequency applied to the tube by the electro-mechanical actuator.

The first support portion may include one or more openings that extend along a side of the first support portion between a first end of the first support portion and a second end of the first support portion.

In another aspect, an apparatus includes: a tube; a body including: a first body wall and a second body wall; and a support structure including: a first support portion and a second support portion. The first body wall extends in a first direction, the second body wall extends in a second direction that is different than the first direction, a first portion the tube passes through an opening in the second body wall, the first support portion is configured to attach to the first body wall, and, when the first support portion is attached to the first body wall, a second portion of the tube passes through the second support portion.

In another aspect, an apparatus for an extreme ultraviolet light source includes: a tube including a side wall having a length that extends from a first end to a second end; an actuator mechanically coupled to an exterior of the side wall; a body including: a first body wall, and a second body wall; and a fitting disposed at an end of the body, the fitting including a passage. A first portion of the side wall is held at an opening in the second body wall, a second portion of the side wall is disposed in the passage, the actuator is between the fitting and the second end of the tube, and approximately half of the length of the side wall is surrounded by the body.

More than half of the length of the side wall may be surrounded by the body.

In another aspect, an apparatus for an extreme ultraviolet light source includes: a tube including a side wall that extends from a first end to a second end; an actuator mechanically coupled to an exterior of the side wall; a body including: a first body wall, and a second body wall; and a fitting disposed at an end of the body, the fitting including a passage and a ferrule, wherein a portion of the side wall is in the passage, and the ferrule is between the portion of the side wall and the fitting.

Implementations may include one or more of the following features. The apparatus also may include a metal wire with a thin layer of polymer material connected to the fitting and encircling an exterior of the side wall, and the wire may be configured to reduce vibration of the tube. The layer of polymer material may form a coating on the metal wire. The apparatus also may include a support structure that includes a first support portion and a second support portion, the first support portion may be configured to attach to the first body wall, and, when the first support portion is attached to the first body wall, the tube passes through the second support portion. The second support portion may be configured to protect the layer of polymer from plasma in the EUV light source. In some implementations, the second support portion is not in mechanical contact with the tube.

The ferrule may extend beyond the fitting.

In another aspect, a support structure for a target material supply system includes: a first support portion; and a second support portion. The first support portion is configured to attach to a first body wall of the target material supply system, and, when the first support portion is attached to the first body wall, a tube of the target material supply system passes through the second support portion.

The target material supply system may be configured to be coupled to a vacuum chamber of an extreme ultraviolet light source.

Implementations of any of the techniques described above may include an EUV light source, a system, a method, a process, a device, or an apparatus. The details of one or more implementations are set forth in the accompanying drawings and the description below. Other features will be apparent from the description and drawings, and from the claims.

DRAWING DESCRIPTION

FIGS. 3A-3D, 4, 5, 6A, 6B, 6C, 7A, 7B, 8-12, 13A, 13B, and 15 show various aspects of various implementations and/or components of a nozzle apparatus.

Figure 14:
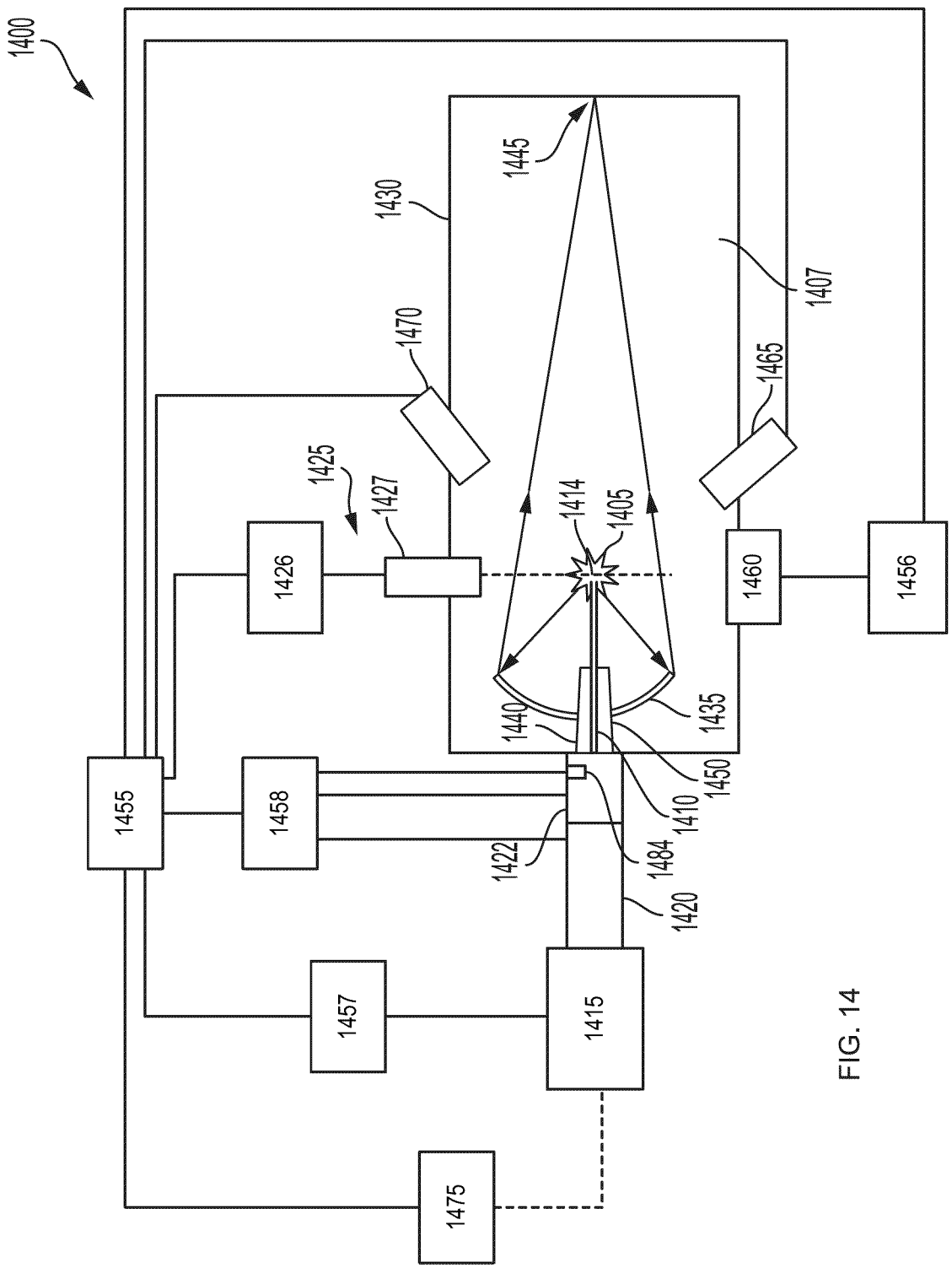

FIG. 14 is a block diagram of another EUV light source.

DETAILED DESCRIPTION

Figure 1:
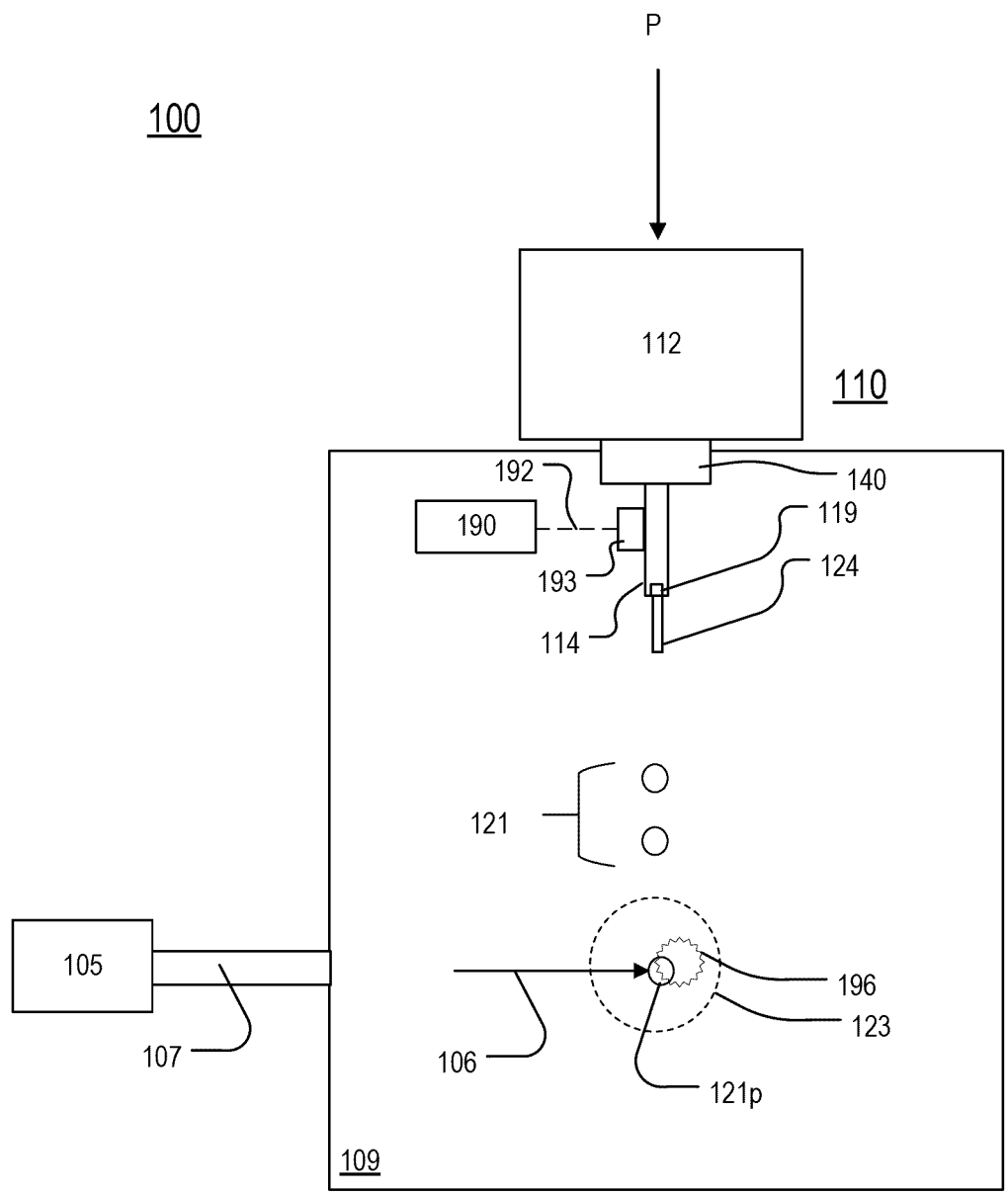
FIG. 1 is a block diagram of an implementation of an extreme ultraviolet (EUV) light source.

Referring to FIG. 1, a block diagram of an EUV light source 100 that includes a supply system 110 is shown. The supply system 110 emits a stream of targets 121 such that a target 121p is delivered to a plasma formation location 123 in a vacuum chamber 109. The target 121p includes target material, which is any material that emits EUV light when in a plasma state. For example, the target material may include water, tin, lithium, and/or xenon. The plasma formation location 123 receives a light beam 106. The light beam 106 is generated by an optical source 105 and delivered to the vacuum chamber 109 via an optical path 107. An interaction between the light beam 106 and the target material in the target 121p produces a plasma 196 that emits EUV light.

The supply system 110 includes a capillary tube 114 that is fluidly coupled to a reservoir 112. The capillary tube 114 is held by a nozzle apparatus 140. The capillary tube 114 defines an orifice 119 through which a material flows to form the stream of targets 121. The nozzle apparatus 140 is configured to reduce, mitigate, or prevent unintentional vibrations of the capillary tube 114. Unintentional vibrations may lead to pointing instability in the stream of targets 121 such that the targets do not travel in an expected direction. Such instability results in the targets not being directed to an expected location for further processing. In the example of an EUV light source such as the light source 100 of FIG. 1, the pointing instability may cause the target 121p to travel to a location other than that of the optimal plasma formation location 123, leading to reduced or no plasma production and reduced or no EUV light generation. Accordingly, it is desirable to reduce or eliminate unintentional vibration of the capillary tube 114.

FIGS. 3A-3D, 4, 5, 6A, 6B, 6C, 7A, 7B, 8-12, 13A, 13B, and 15 show various implementations of the nozzle apparatus 140 and/or components of the nozzle apparatus 140. An overview of the EUV light source 100 and the supply system 110 is provided prior to discussing the various implementations of the nozzle apparatus 140. The EUV light source 100 is an example of a system in which the nozzle apparatus 140 may be used. However, the nozzle apparatus 140, and any of its various implementations, may be used in systems other than an EUV light source.

In the example of FIG. 1, the capillary tube 114 is mechanically coupled to an actuator 193, which is connected to a control system 190 via a control link 192. The control system 190 may include a function generator, an electronic processor (not shown), and an electronic storage (not shown) to carry out the functions of the control system 190. The control link 192 is any type connection capable of transferring an electronic signal from the control system 190 to the actuator 193. For example, the control link 192 may be a wired and/or wireless connection configured to transmit electronic signals and commands from the control system 190 to the actuator 193.

The control system 190 generates signals that, when applied to the actuator 193 or to an element associated with the actuator 193, cause the actuator 193 to move. For example, the actuator 193 may be a piezoelectric ceramic material that changes shape based on an applied voltage. The magnitude and/or polarity of the voltage applied to the actuator 193 is based on the signals from the control system 190. Due to the mechanical coupling between the capillary tube 114 and the actuator 193, when the actuator 193 moves or vibrates, the capillary tube 114 experiences a corresponding motion or vibration. The vibrations imparted by the actuator 193 are generally intentional vibrations. More specifically, a radial contraction of the actuator results in a local contraction of the capillary and the expansion of the actuator results in the local expansion of the capillary. This expansion and contraction results in a creation of acoustic waves at the frequency of the applied electrical signal in the target material that is located inside of the capillary.

The reservoir 112 contains target material under pressure P. The target material is in a molten state and is able to flow, and the pressure in the vacuum chamber 109 is lower than the pressure P. The molten state may include melted metallic target material. Thus, the target material flows through the capillary tube 114 and is emitted into the chamber 109 through the orifice 119. The target material exits the orifice 119 as a jet or continuous stream 124 of target material. The jet of target material breaks up into individual droplets. The break-up of the jet 124 may be controlled such that the individual droplets coalesce into larger droplets that arrive at the plasma formation location 123 at a desired rate by vibrating the capillary tube 114 and creating acoustic waves inside of the capillary tube 114.

For example, the control system 190 may provide a signal that has at least a first frequency and a second frequency via the control link 192 to thereby drive the actuator 193 to vibrate at the first and second frequencies. The first frequency may be in the megahertz (MHz) range. Vibrating the capillary tube 114 at the first frequency causes the jet 124 to break into relatively small droplets of desired sizes and speeds. The second frequency is lower than the first frequency. For example, the second frequency may be in the kilohertz (kHz) range. The second frequency is used to modulate the velocity of the droplets in the stream and to encourage target coalescence. Driving the capillary tube 114 at the second frequency causes groups of droplets to form. In any given group of droplets, the various droplets travel at different velocities. The droplets with higher velocities may coalesce with the droplets with lower velocities to form larger coalesced droplets that make up the stream of targets 121 for the EUV source. These larger droplets are separated from each other by a larger distance than the non-coalesced droplets. The larger separation helps to mitigate the influence of the plasma formed from one target on the trajectory of the subsequent targets in the droplet stream. The targets in the stream of targets 121 may be approximately spherical, with a diameter of about 30 µm.

By causing the capillary tube 114 to vibrate in this manner, the final targets may be generated at frequencies of, for example, between 40 to 300 kHz and may travel toward the plasma formation location 123 at a velocity of, for example, between 40 and 120 meters per second (m/s) or up to 500 m/s. The spatial separation between two adjacent targets in the stream of targets 121 may be, for example, between 1 and 3 millimeters (mm). Between 50 and 300 initial droplets (also called Rayleigh droplets) may coalesce to form a single larger target.

Thus, the capillary tube 114 is intentionally moved or vibrated, and this intentional motion or vibration is controlled to encourage coalescence of target material and to control the rate of target production. The intentional vibrations and/or environmental effects may lead to other, unintentional, cantilever type vibrations of the capillary tube 114. The nozzle assembly 140 reduces or eliminates the unintentional vibrations while allowing the intentional vibrations. An example of the capillary tube 114 and actuator 193 are discussed prior to discussing examples of the nozzle assembly 140 in more detail.

Figure 2A:
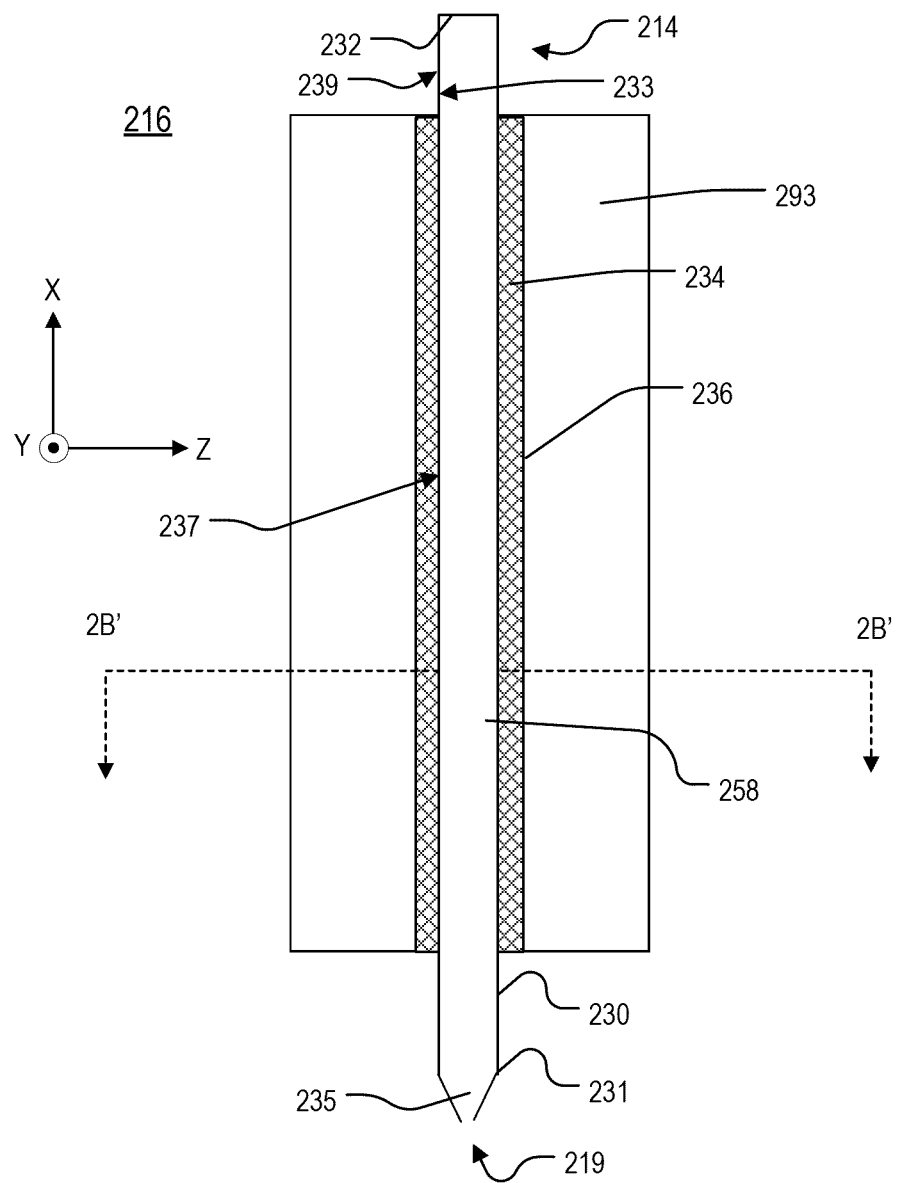
FIG. 2A is a side-cross sectional view of a target formation apparatus.
Figure 2B:
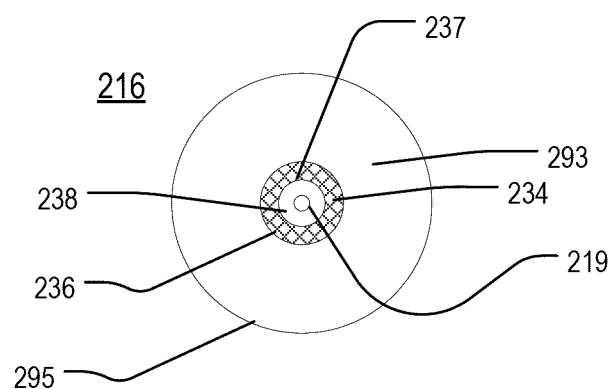
FIG. 2B is a top cross-sectional view of the target formation apparatus of FIG. 2A.

FIG. 2A is a side cross-sectional view of a target formation apparatus 216 in an X-Z plane. FIG. 2B is a top cross-sectional view of the target formation apparatus 216 in a Y-Z plane taken along the line 2B'-2B' of FIG. 2A.

The target formation apparatus 216 may be used in the EUV light source 100 (FIG. 1). The target formation apparatus 216 includes a capillary tube 214 that is mechanically coupled to an actuator 293 by an adhesive 234 (shown in cross-hatch shading). For example, the adhesive 234 may be an epoxy, a benzoxazine resin, a resin containing benzoxazines, a bismaleimide resin, a cyanate ester resin, or a resin containing cyanate esters. Although the example of FIGS. 2A and 2B includes the adhesive 234, the actuator 293 and the capillary tube 214 may be coupled by direct contact (for example, an interference fit or by using fasteners) and without using an adhesive.

The capillary tube 214 includes a sidewall 230 that extends along the X direction from a first end 231 to a second end 232. The sidewall 230 is a three-dimensional object that is generally cylindrical. The sidewall 230 includes an inner surface 233 and an outer surface 239. The inner surface 233 defines an interior region 238 (FIG. 2B) that is in fluid communication with a nozzle 235 at the first end 231. The nozzle 235 narrows along the −X direction to define an orifice 219. In operational use, the interior region 238 is fluidly coupled to a reservoir of target material (such as the reservoir 112 of FIG. 1), and molten target material flows in the interior region 238 of the capillary tube 214 and through the orifice 219 in the −X direction.

In the example of FIGS. 2A and 2B, the actuator 293 is a cylinder with an outer actuator surface 295 and an inner actuator surface 236. The inner actuator surface 236 defines an open central region that extends along the X direction. The inner actuator surface 236 completely surrounds a portion 237 (FIG. 2A) of the outer surface 239. The portion 237 includes any part of the outer surface 239 that is surrounded by the actuator 293. The portion 237 may extend from the first end 231 to the second end 232, or the portion 237 may extend along the X direction over less than the entire length of the sidewall 230. In the example of FIG. 2A, the portion 237 extends in the X direction over less than the entire length of the sidewall 230. The actuator 293 is mechanically coupled to the portion 237 with the adhesive 234.

The actuator 293 is made of any material that is capable of causing the sidewall 230 to move. The actuator 293 may be an electro-mechanical actuator. For example, the actuator 293 may be a piezoelectric ceramic material such as lead zirconate titanate (PZT) that changes shape in response to the application of voltage. By changing shape, the PZT also causes the capillary tube 214 to move. The actuator 293 causes symmetrical displacement of the wall of the capillary tube 214 by periodical radial contraction and expansion.

FIGS. 3A-3D show a nozzle apparatus 340. The nozzle apparatus 340 is an implementation of the nozzle apparatus 140 (FIG. 1). FIG. 3A is a side cross-sectional view of the nozzle apparatus 340 in the X-Z plane. The nozzle apparatus 340 includes a body 350 and a support structure 360.

The body 350 includes a first body wall 352 and a second body wall 354 that is connected to the first body wall 352. The first body wall 352 extends in the X direction. The second body wall 354 extends in the Y direction. The support structure 360 includes a first support portion 362 and a second support portion 364 that is connected to the first support portion 362. The first support portion 362 extends in the X direction from an end 367 to an end 368. The second body wall 354 defines an opening 355. The second support portion 364 defines an opening 365. The nozzle apparatus 340, the body 350, and the support structure 360 are three-dimensional structures. In the example of FIGS. 3A-3D, the first body wall 352 and the first support portion 362 are generally cylindrical structures. The second body wall 354 and the second support portion 364 are disk-shaped objects that define the respective openings 355 and 365.

The body 350 defines an interior 351 that may be fluidly connected to a reservoir (such as the reservoir 112 of FIG. 1) such that the interior 351 receives fluid (such as target material) from the reservoir through an end opposite an end 357. The second body wall 354 supports and provides a seal around an exterior of the capillary tube 314. The seal is a high-pressure seal that joins the capillary tube 314 to the second body wall 354 and allows a high-pressure environment to be maintained in the interior 351 of the body 350. The seal may be, for example, a compression seal that includes an expandable and compressible material (such as a polymer) and/or the seal may be formed from an adhesive. The nozzle apparatus 340 also includes a fitting 494, which is attached to the end 357 of the first body wall 352. The fitting 494 may be a compression fitting. The fitting 494 may be attached to the end 357 with, for example, an adhesive or by an interference fit. In some implementations, the fitting 494 includes threading and attaches to a corresponding threaded interface of the end 357. The fitting 494 includes a passage 389 that passes all the way through the fitting 494. When the nozzle apparatus 340 is in an assembled form (such as shown in FIG. 3A), the capillary tube 314 passes through the passage 389 and the openings 355, 365. The second support portion 364 holds the capillary tube 314 near the end 331. FIG. 3A shows the nozzle apparatus 340 in an assembled state. FIG. 3C is a side view of the body 350 in an unassembled state. FIG. 3D is a side view of the support structure 360 in an unassembled state. In the unassembled state, the body 350 and the support structure 360 are not attached to each other.

When the nozzle apparatus 340 is assembled, the support structure 360 is attached to the end 357 of the body 350. Specifically, a portion of an inner surface 363 that is at the end 368 of the first support portion 362 is attached to an outer surface 356 of the first body wall 352. The first body wall 352 and the first support portion 362 may be attached to each other by, for example, an interference fit between the inner surface 363 and the outer surface 356, an adhesive that bonds the outer surface 356 and the inner surface 363, by mechanical devices such as fasteners, by a threaded interface, or by any other means capable of holding the support structure 360 to the body 350.

Additionally, when the nozzle apparatus 340 is assembled, a capillary tube 314 passes though the openings 355 and 365. The capillary tube 314 includes a sidewall that extends generally along the X direction from an end 331 to an end 332. The sidewall 330 is generally cylindrical and has an inner diameter 387 and an outer diameter 388. The inner diameter 387 may be, for example, around 0.1 millimeter (mm), around 0.3 mm, around 0.5 mm, or around 0.8 mm. The outer diameter 388 may be, for example, about 0.25 mm larger than the inner diameter 387. The inner diameter 387 and the outer diameter 388 may be largely uniform along the length of the tube 314 (along the X direction in FIG. 3A). The inner diameter 387 and the outer diameter 388 of the tube 314 may taper toward an orifice 319 (for example, as shown in the implementation of FIG. 2A). The orifice 319 may have a diameter in the Y-Z plane of 1 to 5 micrometers (μm), for example, around 1 μm, around 3 μm or around 5 μm. The capillary tube 314 includes the orifice 319 at the end 331. The orifice 319 allows the target material to flow out of the capillary tube 314. The capillary tube 314 passes through the opening 365. In the example shown in FIG. 3A, the end 332 is relatively close to the opening 355 such that only a small portion (for example, less than about 10%) of the length of the capillary tube along the X axis extends into the interior 351. In some implementations, the end 332 is flush with the opening 355.

FIG. 3B shows the second support portion 364 in the Y-Z plane with the capillary tube 314. The opening 365 may be off-center or displaced relative to the center of the end 368 in the Y-Z plane. Having the opening 365 off-center may help to provide a more reliable mechanical contact between the capillary tube 314 and the second support portion 364.

The body 350 may be made of a rigid material. For example, the body 350 may be made of metal. The support structure 360 may be made of a rigid material. For example, the first support portion 362 and the second support portion 364 may be made a solid metal or a rigid polymer material. In some implementations, the first support portion 362 and/or the second support portion 364 are made of a non-rigid or flexible material. A non-rigid material or flexible material is a material that bends or flexes in response to an applied force without breaking and returns to its original shape and position after the force is removed.

The second support portion 364 holds and supports the capillary tube 314 in the opening 365 near the end 331. The capillary tube extends for a distance 381 in the −X direction from the opening 355 to the opening 365. Without the support structure 360, the capillary tube 314 would extend for the distance 381 without support other than support provided by the body 350. Without the support structure 360, the portion of the capillary tube 314 that extends in the −X direction from the opening 355 acts as a cantilever having a length 381. In such a configuration (without the support structure 360), the capillary tube 318 experiences deflection in the Y-Z plane in response to an applied force or environmental vibrations. The amplitude of the deflections increases as the distance 381 increases. Such deflections lead to unwanted vibrations of the capillary tube 314 in the Y-Z plane, and these unwanted vibrations may be referred to as unwanted transverse vibrations.

On the other hand, by holding and supporting the capillary tube 314 near the end 331, the unsupported length of the capillary tube 314 is reduced. Thus, the support structure 360 reduces, mitigates, or prevents unintentional vibrations of the capillary tube 314. The unintentional vibrations may be transverse vibrations in the Y-Z plane that are caused by moving items in the vicinity of the capillary tube 314. For example, the unintentional vibrations may be from moving items near the capillary tube 314 that are mechanically coupled to the capillary and therefore are transferring the vibrations. The moving items may include, for example, vacuum pumps, fluid lines, and/or fans. Additionally, vibrations caused by moving items may combine with intentional vibrations (such as vibrations caused by an actuator, such as the actuator 293 of FIGS. 2A and 2B, coupled to the capillary tube 314) and emphasize intentional vibrations in unexpected ways. In other words, unintentional vibrations may occur due to environmental factors and/or due to modification of intentional vibrations. Finally, the unwanted vibrations may be caused by a transfer of the energy of the intentional vibrations applied to the capillary tube 314 by the actuator via a non-linear mechanical response of the system to unwanted, transverse vibrations.

Figure 4:
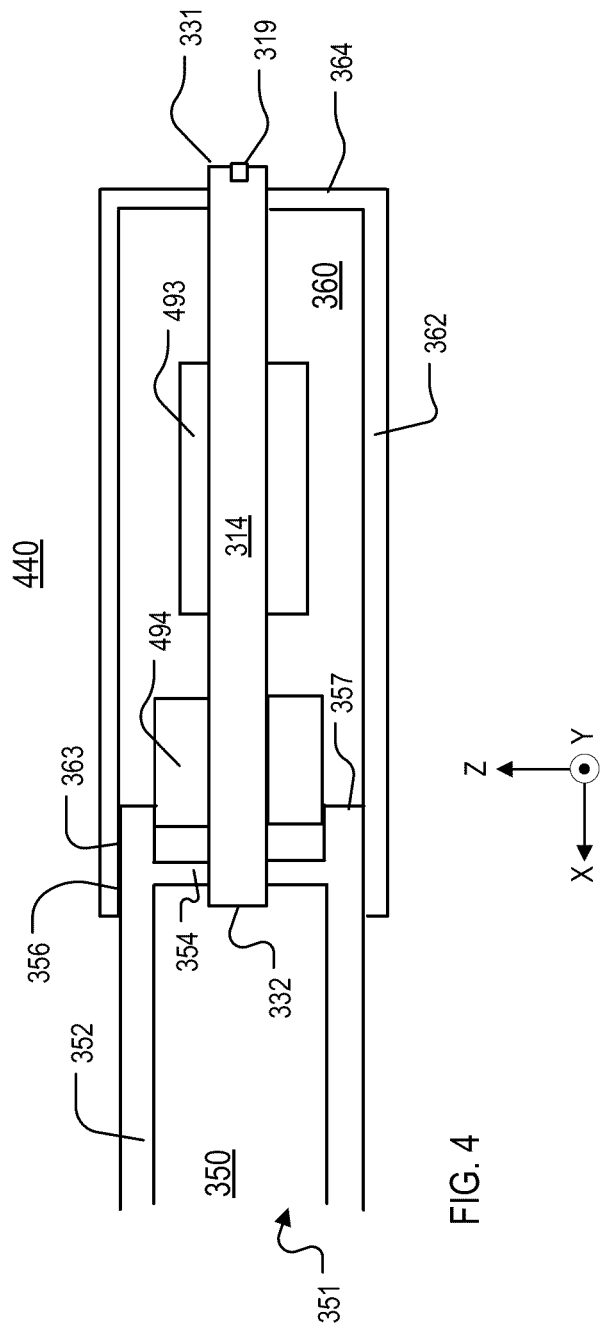

FIG. 4 is a side cross-sectional view of a nozzle apparatus 440 in the X-Z plane. The nozzle apparatus 440 is another implementation of the nozzle apparatus 140 (FIG. 1). The nozzle apparatus 440 is similar to the nozzle apparatus 340 (FIGS. 3A-3D), except the nozzle apparatus 440 includes an actuator 493. The actuator 493 is similar to the actuator 293 (FIGS. 2A and 2B). The actuator 493 is between the fitting 494 and the second support portion 364.

In operational use, the actuator 493 is controlled to vibrate the capillary tube 314 in an intentional way. For example, the actuator 493 may be controlled to apply a sine wave, a square wave, a saw-tooth wave, and/or any other time-varying wave to the capillary tube 314 such that the tube 314 vibrates. The actuator 493 may be controlled to vibrate the tube 314 based on a time-varying signal that is a combination of one or more time-varying signals. For example, the actuator 493 may be controlled to vibrate the tube 314 based on a pulse wave that has a frequency of 50 kHz or a sine wave that has a frequency of 50 kHz and a pulse wave (or square wave) that has a frequency of 500 kHz. In implementations in which the actuator 493 applies a sine wave to the tube 314, the sine wave has a fundamental frequency of, for example, 40 kHz to 100 kHz.

In implementations in which the actuator 493 applies a time-varying signal that is not a sine wave, the applied signal imparts a vibration that has a plurality of frequency components that include a fundamental frequency and harmonics of that fundamental frequency. The harmonics of the fundamental frequency occur at integer multiples of the fundamental frequency. For example, an applied pulse wave that has a fundamental frequency of 100 kHz has harmonics at 200 kHz, 300 kHz, 400 kHz, and so on. For the example provided above in which the tube 314 is vibrated based on a combination of a sine wave at 50 kHz and a pulse wave at 500 kHz, the intentional vibration includes a fundamental frequency component at 50 kHz and also includes frequency components at 500 kHz, 1 MHz, 1.5 MHz and so on.

In addition to these intentional vibrations, unintentional vibrations also may occur due to environmental factors and/or unintentional vibrations of the actuator 493. By holding the capillary tube 314 near the end 331, unintentional vibrations are reduced.

Figure 5:
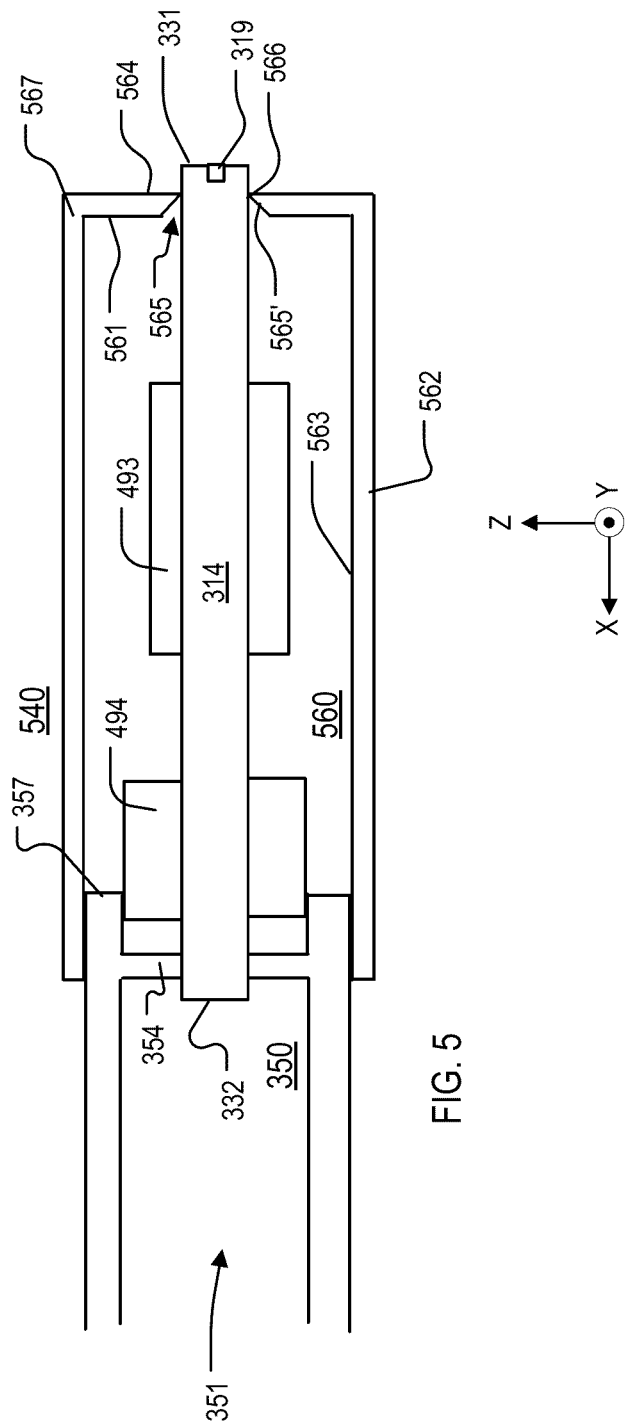

FIG. 5 is a side cross-sectional view of a nozzle apparatus 540 in the X-Y plane. The nozzle apparatus 540 includes the body 350 and a support structure 560. The support structure 560 may be made of a rigid material, such as, for example, a metal material, a rigid polymer material, or a ceramic material. The nozzle apparatus 540 is similar to the nozzle apparatus 440 (FIG. 4), except the support structure 560 includes a second support portion 564 with an opening 565 that has a chamfered or beveled edge 565' that extends at an angle from an inner side 561 of the second support portion 564 to a tip 566.

The second support portion 564 extends in the Y-Z plane and is connected to an end 567 of a first support portion 562. The tip 566 holds a portion of the capillary tube 314 near the end 331. The chamfered edge 565' and the second support portion 564 are oriented such that the chamfered edge 565' extends toward the end 331, and the tip 566 is between the end 331 and the inner side 561. Thus, the tip 566 holds the capillary tube 314 close to the end 331 and reduces unwanted vibrations.

FIG. 6A is a side cross-sectional view of a nozzle apparatus 640 in the X-Y plane. The nozzle apparatus 640 includes the body 350 and a support structure 660. When the nozzle apparatus 640 is assembled (as shown in FIG. 6A), the capillary tube 314 extends through the opening 355 and an opening 665 in the support structure 660.

The nozzle apparatus 640 is similar to the nozzle apparatus 540 (FIG. 5) and the nozzle apparatus 440 (FIG. 4), except the support structure 660 of the nozzle apparatus 640 includes a first support portion 662 and a second support portion 664 that have different features as compared to the first support portion 462 and the second support portion 464 of the support structure 460, and the first support portion 562 and the second support portion 564 of the support structure 560. FIG. 6B shows the support structure 660 in the Y-Z plane from the perspective indicated by the line 6B 6B'. FIG. 6C shows a perspective view of the support structure 660.

The first support portion 662 extends in the X direction from an end 667 to an end 668. The first support portion 662 includes three flexible prongs 676a, 676b, 676c and a rigid prong 679. The 676a, 676b, 676c and the rigid prong 679 are collectively referred to as segments. Each of the flexible prongs 676a, 676b, 676c and the rigid prong 679 extend in the X direction from the end 667 to the end 668. Each of the flexible prongs 676a, 676b, 676c and the rigid prong 679 are spaced apart from each other about the end 667 to define four respective openings 672a, 672b, 672c, 672d. The openings 672a, 672b, 672c, 672d pass through an exterior surface of the first support portion 662. The support structure 660 shown in FIGS. 6A-6C includes the three flexible prongs 676a, 676b, 676c. However, in other implementations, the first support portion 662 may include more or fewer than three flexible prongs.

The rigid prong 679 is made of a rigid material. For example, the rigid prong 679 and the base portion 691 may be made of a solid metal or a rigid polymer material. The flexible prongs 676a, 676b, 676c are made of a flexible material that bends or flexes in response to an applied force without breaking and returns to its original shape and position after the force is removed.

The second support portion 664 includes an adjustment mechanism 669 (shown with grey shading) and a contact portion 671, which defines the opening 665. The second support portion 664 is connected to the first support portion 662 at the end 667 and extends in the Y-Z plane. The adjustment mechanism 669 passes through the rigid prong 679 of the first support portion 662 in the Z-direction and makes contact with the contact portion 671. The adjustment mechanism 669 may be, for example, a set screw or an adjustment screw.

The contact portion 671 and the second support portion 664 may be made of a durable material, such as, for example, a metal material. In some implementations, the second support portion 664 and the contact portion 671 are made of a non-rigid material such as a polymer. The adjustment mechanism 669 may be set during manufacture of the nozzle apparatus 640, for example, as the final step of the manufacturing process. In other implementations, the adjustment mechanism 669 is configured to be adjusted in the field and after the manufacturing process is completed.

The adjustment mechanism 669 may be moved in the −Z and Z directions. Moving the adjustment mechanism 669 in the Z direction brings the contact portion 671 into physical contact with the capillary tube 314. The adjustment mechanism 669 moves the second support portion 664 in the Z direction as the adjustment mechanism 669 is moved in the Z direction. The flexible prongs 676 bend and move in the Z direction at the end 667 as the adjustment mechanism 669 is moved in the Z direction allowing the contact portion 671 to move into physical contact with the capillary tube 314. After physical contact is established, continuing to move the adjustment mechanism 669 in the Z direction may improve the mechanical coupling between the capillary tube 314 and the contact portion 671. Improving the mechanical contact enhances the ability of the second support portion 664 to secure the capillary tube 314 and thus reduces vibration of the capillary tube 314.

FIG. 7A is a side cross-sectional view of a nozzle apparatus 740. The nozzle apparatus 740 is another implementation of the nozzle apparatus 140 (FIG. 1). The nozzle apparatus 740 is similar to the nozzle apparatus 540 (FIG. 5), except the nozzle apparatus 740 includes a ferrule 770 (shown with diagonal striped shading), as discussed below.

The nozzle apparatus 740 includes the body 350 and a support structure 760. The support structure 760 includes a first support portion 762 that extends in the X direction from an end 768 to an end 767. The first support portion 762 is generally cylindrical. The support structure 760 also includes a second support portion 764 connected to the first support portion 762 at the end 767. The second support portion 764 extends in the Y-Z plane. FIG. 7B shows the support structure 760 in the Y-Z plane from the perspective indicated by the line 7B 7B'. The second support portion 764 defines an opening 765. When the nozzle apparatus 740 is assembled (such as shown in FIGS. 7A and 7B), the capillary tube passes through the opening 355 and the opening 765.

The second support portion 764 has a circular cross-section in the Y-Z plane. The second support portion 764 includes the ferrule 770 and an outer portion 773. The ferrule 770 is a ring or disk-shaped object that surrounds the opening 765 and is in physical contact with the capillary tube 314. The ferrule 770 holds the capillary tube 314 near the end 331. The outer portion 773 is connected to the ferrule 770 such that the outer portion 773 and the ferrule 770 form a single piece (and together are the second support portion 764). The ferrule 770 may be, for example, press fit into the outer portion 773 or attached to the outer portion 773 with an adhesive or a mechanical fastener. The outer portion 773 is connected to the end 767 of the first support portion 762.

The outer portion 773 and the first support portion 762 are made of the same material. For example, the outer portion 773 and the first support portion 762 may be made from a solid and rigid metal material. The ferrule 770 is made from a material that is softer than the material of the outer portion 773. For example, in implementations in which the outer portion 773 is made from a solid metal material, the ferrule 770 may be made of a polymer material, such as, for example Teflon or polyimide, or the ferrule 770 may be made of or include an adhesive, such as, for example, bismaleimide resin or a cyanate ester based resin. In some implementations, the ferrule 770 is made of a solid polymer and attached to the outer portion 773 with an adhesive.

Because the ferrule 770 is a softer material than the outer portion 773, the ferrule 770 is less likely to damage (for example, scratch or crack) the capillary tube 314. Moreover, because the ferrule 770 is made of a relatively soft material, the ferrule 770 may be more firmly coupled to the capillary tube 314, thus enhancing the ability of the second support portion 764 to prevent unintended transverse (Y-Z) vibrations in the capillary tube 314.

Figure 8:
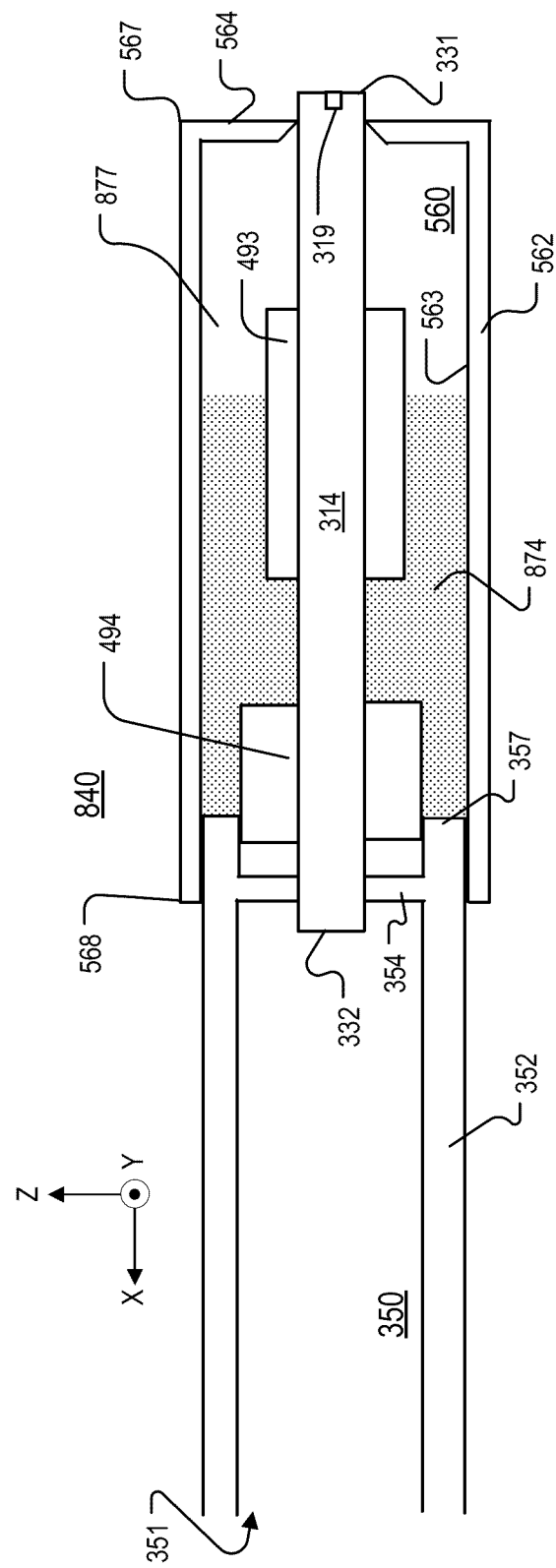

FIG. 8 is a side cross-sectional view of a nozzle apparatus 840. The nozzle apparatus 840 is another implementation of the nozzle apparatus 140 (FIG. 1). The nozzle apparatus 840 is similar to the nozzle apparatus 540 (FIG. 5). The nozzle apparatus 840 includes the body 350 and the support structure 560, both of which are discussed above. However, the nozzle apparatus 840 also includes a potting compound 874 in the support structure 560. The potting compound 874 is in an enclosed space 877, which is defined by the inner side 563 of the first support portion 562, the second support portion 564, the end 357, the second body wall 354, and the fitting 494. The potting compound 874 provides additional mechanical support to the capillary tube 314 and further damps unintentional vibrations of the capillary tube 314.

The potting compound 874 may be any material that is able to support the capillary tube 314 during operation of the nozzle apparatus 840. For example, the potting compound 874 may be an adhesive such as, for example, a bismaleimide-based adhesive, a benzoxazine-based adhesive, a cyanate ester based adhesive, a room-temperature-vulcanizing (RTV) adhesive, or a high temperature epoxy adhesive.

The potting compound 874 may be arranged in the space 877 in any manner that allows the potting compound to provide mechanical support to the capillary tube 314. The potting compound 874 may occupy any portion of the space 877. For example, the potting compound 874 may make physical contact with the inner side 561 and the capillary tube 314 and occupy at least approximately one-third of the total volume of the space 877. The potting compound may occupy more than one-third of the total volume of the space 877. For example, in some implementations, the potting compound 874 occupies the entire space 877. In implementations in which the potting compound 874 occupies less than the entire space 877, the potting compound 874 may be arranged in any portion of the space 877. For example, in some implementations, the potting compound 874 fills a portion of the space 877 that is adjacent to the body 350 and no potting compound 874 is present in the portion of that space 877 that is adjacent to the second support portion 564. Such an arrangement of the potting compound 874 helps to ensure that the potting compound 874 does not interfere with the flow of material through an orifice at the end 331.

In implementations that include the potting compound 878, the second support portion 564 is not necessarily in mechanical contact with the tube 314. For example, the tube 314 and the second support portion 564 may be arranged such that the tube 314 does not touch the second support portion 564. The potting compound 874 supports the tube 314 and the second support portion 564 may be configured to not provide support for the tube 314 or to not be the sole source of support for the tube 314. In these implementations, the second support portion 564 protects the potting compound 874 from the damage that may be caused by the direct exposure to light (for example, EUV light and/or other short wavelength light) emitted from the plasma 196 (FIG. 1).

Figure 9:
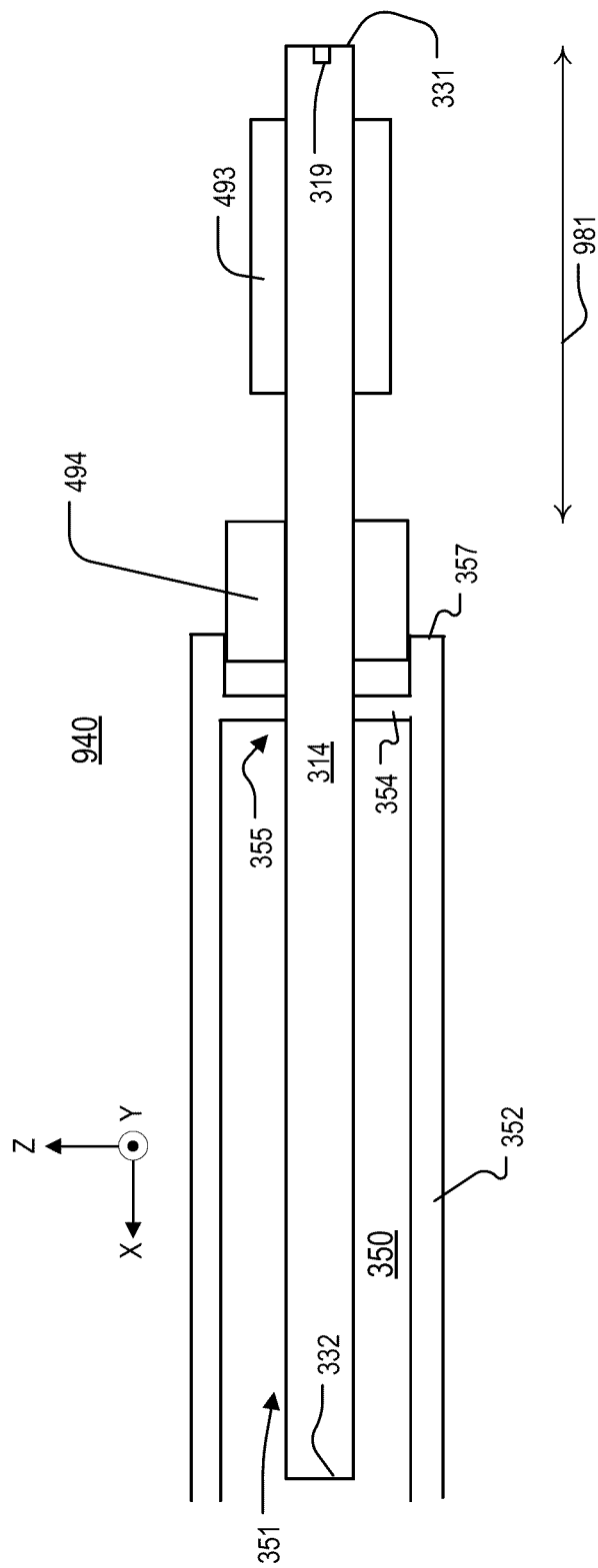

FIG. 9 is a side cross-sectional view of a nozzle apparatus 940. The nozzle apparatus 940 is another implementation of the nozzle apparatus 140 (FIG. 1). The nozzle apparatus 940 includes the body 350 and the fitting 494, which is attached to the end 357 of the body 350. The nozzle apparatus 940 also includes the capillary tube 314. The capillary tube 314 extends through the body 350 and the fitting 494. The actuator 493 is mechanically coupled to the capillary tube 314 between the fitting 494 and the end 331.

The capillary tube 314 extends unsupported from the fitting 494 to the end 331 for a distance 981. Compared to the implementations discussed with respect to FIGS. 3A, 4, 5, 6A, 7A, and 8, a larger portion of the capillary tube 314 is surrounded by the body 350. In other words, a larger portion of the capillary tube 314 in in the interior 351. For example, in the nozzle apparatus 940, at least half of the capillary tube 314 may be surrounded by the body 350. In such an implementation, the distance 981 is less than half of the distance from the end 331 to the end 332. The total extent of the capillary tube 314 from the end 331 to the end 332 is unchanged. Thus, the capillary tube 314 has the same acoustic resonances and responds to intentional vibrations as expected to control the emission of material from the orifice 319.

However, because more of the capillary tube 314 is surrounded by the body 350, the unsupported portion of the capillary tube 314 is reduced significantly and therefore the capillary is less susceptible to unintentional vibrations, and the nozzle structure 940 may be used without a support structure such as the support structures 360, 460, 560, 660, 760, and 860.

Figure 10:
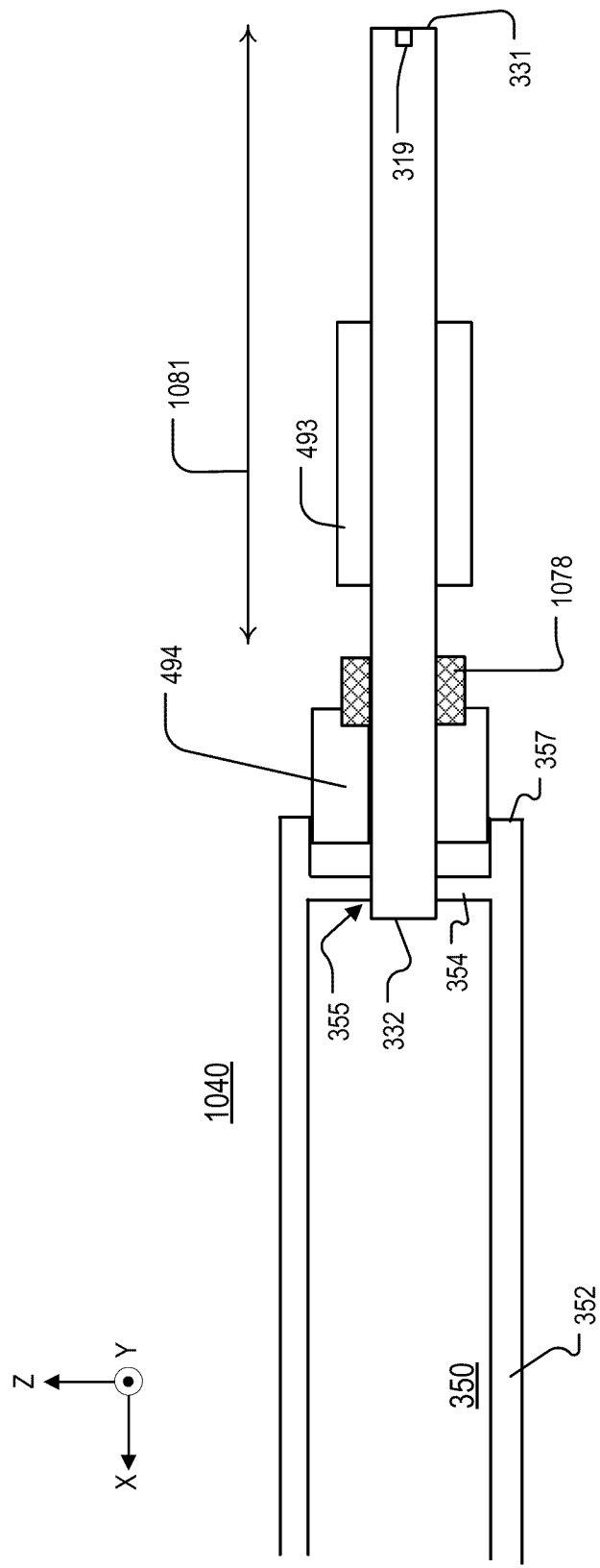

FIG. 10 is side cross-sectional view of a nozzle apparatus 1040. The nozzle apparatus 1040 is another implementation of the nozzle apparatus 140 (FIG. 1). The nozzle apparatus 1040 includes the body 350, the fitting 494, and a supporting ferrule 1078. When the nozzle apparatus 1040 is assembled (such as shown in FIG. 10), the capillary tube 314 passes through the opening 355 and the fitting 494. The capillary tube 314 extends for a distance 1081 from the ferrule 1078 and the fitting 494 to the end 331

The supporting ferrule 1078 is attached to the fitting 494 and surrounds the capillary tube 314. The supporting ferrule 1078 is rigidly attached to the fitting 494 and the capillary tube 314 by, for example, an adhesive. Additionally, a mechanical fastener, such as, for example, a nut, compression fitting, or bracket may be used to clamp the ferrule 1078 to the capillary tube 314.

The distance 1081 is smaller than a distance between the fitting 494. In other words, the ferrule 1078 is closer to the end 331 than is the fitting 494, the ferrule 1078 is closer to the actuator 493 than is the fitting 494, and the ferrule 1078 extends beyond the fitting 494 in the −X direction. The supporting ferrule 1078 provides additional support to the capillary tube 314 such that unintended transverse vibrations are reduced or eliminated without the use of a support structure such as the support structures 360, 460, 560, 660, 760, and 860. Moreover, the additional support provided by the ferrule 1078 allows the distance 1081 to be greater than the distance 981. For example, the distance 1081 may be greater than half of the total distance between the end 331 and the end 332, and, in these implementations, less than half of the capillary tube 314 is surrounded by the body 350.

In some implementations of the nozzle apparatus 1040, the capillary tube 314 is arranged with a greater portion of the tube 314 surrounded by the body 350, for example, as discussed with respect to FIG. 9. Regardless of the particular arrangement of the capillary tube 314, the supporting ferrule 1078 provides additional support to the capillary tube 314 such that unintentional vibrations are reduced or eliminated.

Figure 11:
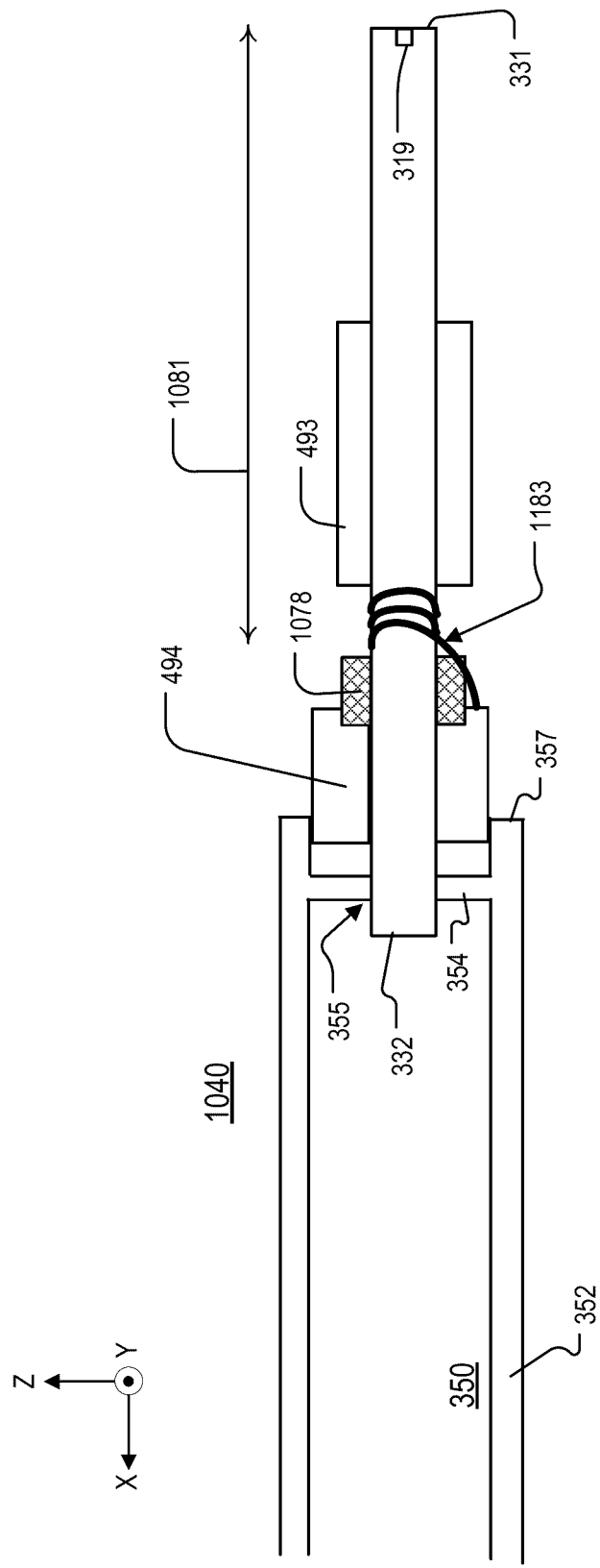

Referring also to FIG. 11, in some implementations, the nozzle apparatus 1040 includes a metal wire with a thin layer of polymer material 1183 that is connected to the fitting 494 and encircles the capillary tube 314. The wire 1183 provides mechanical damping and further reduces unintentional transverse vibrations of the capillary tube 314. The wire 1183 may be, for example, a copper wire that is coated with polymer material, such as, for example, Teflon. It is thought that such wire 1183 provides a path to dissipate high frequency vibrations that are applied to the actuator 493 (for example, harmonics of a 50 kHz square wave modulation signal applied to the actuator 493), and that, by dissipating the high frequency vibrations, unwanted transverse vibrations in the capillary tube 314 are reduced.

In some implementations, the nozzle apparatus 1040 also includes a supporting structure similar to the supporting structure 362 shown in FIG. 4. In these implementations, the purpose of such a supporting structure in the nozzle apparatus 1040 is to protect the polymer material deposited on the wire 1183 from being damaged by light (for example, EUV and/or other short wavelength light) emitted from the target material plasma 196 (FIG. 1).

Figure 12:
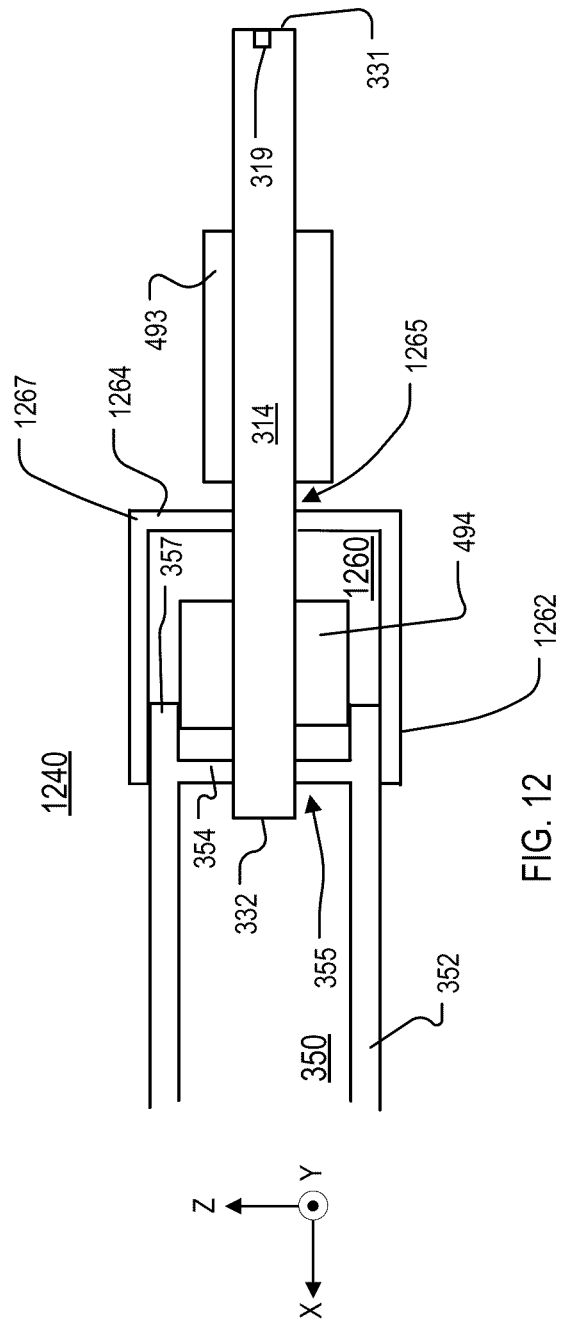

FIG. 12 is a side cross-sectional view of a nozzle apparatus 1240. The nozzle apparatus 1240 is another implementation of the nozzle apparatus 140 (FIG. 1). The nozzle apparatus 1240 includes the body 350 and a support structure 1260. The support structure 1260 provides support to the capillary tube 314 and reduces or eliminates unintentional transverse vibrations. The support structure 1260 includes a first support portion 1262 and a second support portion 1264 that is connected to an end 1267 of the first support portion 1262. The second support portion 1264 defines an opening 1265.

When the nozzle apparatus 1240 is assembled (as shown in FIG. 12), the support structure 1260 is attached to the body 350, and the capillary tube 314 passes through the opening 355 and the opening 1265. The capillary tube 314 is also mechanically coupled to the actuator 493. The actuator 493 is between the second support portion 1264 and the end 331. Thus, the second support portion 1264 is relatively far from the end 331 and the orifice 319, and the second support portion 1264 holds the capillary tube 314 at a position that is not at the end 331 and at a position that is further from the end 331 as compared to the implementations shown in FIGS. 3A, 4, 5, 6A, 7, and 8. The arrangement of the second support portion 1264 relative to the orifice 319 results in fewer connections and objects being near the orifice 319 and may help ensure that the orifice 319 remains free of debris and interference during operational use. Moreover, more room may be available to couple the second support portion 1264 to the capillary tube 314 in a configuration such as shown in FIG. 12.

The support structure 1260 may be made from a flexible material, such as a solid polymer material. The capillary tube 314 may be coupled to the second support portion 1264 at the opening 1265 with, for example, an adhesive such as a glue. Additionally or alternatively, the support structure 1260 may be connected to the fitting 494 by a threaded connection or with an adhesive. Furthermore, in some implementations, a ferrule structure (such as the ferrule 770 of FIG. 7) or a clamping mechanism is between the opening 1265 and the capillary tube 314 and the ferrule structure or the clamping mechanism holds the capillary tube 314.

FIG. 13A is a side cross-sectional view of a nozzle apparatus 1340. The nozzle apparatus 1340 is another implementation of the nozzle apparatus 140 (FIG. 1). The nozzle apparatus 1340 includes a body 1350, a fitting 1394, and an actuator 1393. The body 1350 includes a first body wall 1352 and a second body wall 1354, which defines an opening 1355. The fitting 1394 defines a passage 1389 that passes through the fitting 1394.

When assembled (as shown in FIG. 13A), the nozzle apparatus 1340 includes a capillary tube 1314 that passes through the opening 1355 and the passage 1389 and is mechanically coupled to the actuator 1393. When mounted in the nozzle apparatus 1240, the capillary tube 1314 extends in the X direction from an end 1331 to an end 1332. FIG. 13B shows the end 1331 of the capillary tube 318 in the Y-Z plane. The capillary tube 1314 includes a sidewall 1330 having an outer diameter 1388 and an inner diameter 1387 (FIG. 13B). The outer diameter 1388 is greater than the outer diameter 388 (see FIG. 3) of the sidewall 330 of the capillary tube 314. Specifically, it may be 50 to 500% greater than the outer diameter 388 of the sidewall 330. For example, the outer diameter 1388 may be between about 1.5 mm and about 5.0 mm. As compared to the capillary tube 314, the sidewall 1330 may be approximately 50%, 100%, 200%, or 500% larger relative to the wall thickness along the majority of the capillary tube 318. The radial thickness of the sidewall 1330 is the distance between the outer portion of the sidewall 1130 and in inner portion of the sidewall, which is shown with a dashed line in FIG. 13B. The radial thickness of the sidewall 1330 of the capillary tube 1314 may be, for example, between about 0.35 mm and about 2.0 mm. In the example shown in FIG. 13A, the capillary tube 1314 has the orifice 319, which is the same orifice that is part of the capillary tube 314. However, the capillary tube 1314 may have an orifice that is smaller or larger in the Z direction.

Increasing the diameter of the sidewall 1330 results in the capillary tube 1314 being stiffer and more robust than the capillary tube 1314. Consequently, the capillary tube 1314 experiences fewer unintentional transverse vibrations than the capillary tube 1314.

Any of the nozzle assemblies discussed above may be used in an EUV light source. Referring to FIG. 14, an implementation of an LPP EUV light source 1400 is shown. Any of the nozzle assemblies discussed above may be used in the light source 1400 as part of a supply system 1425.

The LPP EUV light source 1400 is formed by irradiating a target mixture 1414 at a plasma formation location 1405 with an amplified light beam 1410 that travels along a beam path toward the target mixture 1414. The target material discussed with respect to FIG. 1, and the targets in the stream 121 discussed with respect to FIG. 1 may be or include the target mixture 1414. The plasma formation location 1405 is within an interior 1407 of a vacuum chamber 1430. When the amplified light beam 1410 strikes the target mixture 1414, a target material within the target mixture 1414 is converted into a plasma state that has an element with an emission line in the EUV range. The created plasma has certain characteristics that depend on the composition of the target material within the target mixture 1414. These characteristics may include the wavelength of the EUV light produced by the plasma and the type and amount of debris released from the plasma.

The light source 1400 also includes the supply system 1425 that delivers, controls, and directs the target mixture 1414 in the form of liquid droplets, a liquid stream, solid particles or clusters, solid particles contained within liquid droplets or solid particles contained within a liquid stream. The target mixture 1414 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1414 may also include impurities such as non-target particles. Thus, in the situation in which there are no impurities, the target mixture 1414 is made up of only the target material. The target mixture 1414 is delivered by the supply system 1425 into the interior 1407 of the chamber 1430 and to the plasma formation location 1405.

The light source 1400 includes a drive laser system 1415 that produces the amplified light beam 1410 due to a population inversion within the gain medium or mediums of the laser system 1415. The light source 1400 includes a beam delivery system between the laser system 1415 and the plasma formation location 1405, the beam delivery system including a beam transport system 1420 and a focus assembly 1422. The beam transport system 1420 receives the amplified light beam 1410 from the laser system 1415, and steers and modifies the amplified light beam 1410 as needed and outputs the amplified light beam 1410 to the focus assembly 1422. The focus assembly 1422 receives the amplified light beam 1410 and focuses the beam 1410 to the plasma formation location 1405.

In some implementations, the laser system 1415 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser minors or other feedback devices that form a laser cavity. Thus, the laser system 1415 produces an amplified light beam 1410 due to the population inversion in the gain media of the laser amplifiers even if there is no laser cavity. Moreover, the laser system 1415 may produce an amplified light beam 1410 that is a coherent laser beam if there is a laser cavity to provide enough feedback to the laser system 1415. The term "amplified light beam" encompasses one or more of: light from the laser system 1415 that is merely amplified but not necessarily a coherent laser oscillation and light from the laser system 1415 that is amplified and is also a coherent laser oscillation.

The optical amplifiers in the laser system 1415 may include as a gain medium a filling gas that includes $CO_2$ and may amplify light at a wavelength of between about 9100 and about 11000 nm, and in particular, at about 10600 nm, at a gain greater than or equal to 800 times. Suitable amplifiers and lasers for use in the laser system 1415 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The pulse repetition rate may be, for example, 50 kHz. The optical amplifiers in the laser system 1415 may also include a cooling system such as water that may be used when operating the laser system 1415 at higher powers.

The light source 1400 includes a collector mirror 1435 having an aperture 1440 to allow the amplified light beam 1410 to pass through and reach the plasma formation location 1405. The collector minor 1435 may be, for example, an ellipsoidal minor that has a primary focus at the plasma formation location 1405 and a secondary focus at an intermediate location 1445 (also called an intermediate focus) where the EUV light may be output from the light source 1400 and may be input to, for example, an integrated circuit lithography tool (not shown). The light source 1400 may also include an open-ended, hollow conical shroud 1450 (for example, a gas cone) that tapers toward the plasma formation location 1405 from the collector minor 1435 to reduce the amount of plasma-generated debris that enters the focus assembly 1422 and/or the beam transport system 1420 while allowing the amplified light beam 1410 to reach the plasma formation location 1405. For this purpose, a gas flow may be provided in the shroud that is directed toward the plasma formation location 1405.

The light source 1400 may also include a master controller 1455 that is connected to a droplet position detection feedback system 1456, a laser control system 1457, and a beam control system 1458. The light source 1400 may include one or more target or droplet imagers 1460 that provide an output indicative of the position of a droplet, for example, relative to the plasma formation location 1405 and provide this output to the droplet position detection feedback system 1456, which may, for example, compute a droplet position and trajectory from which a droplet position error may be computed either on a droplet by droplet basis or on average. The droplet position detection feedback system 1456 thus provides the droplet position error as an input to the master controller 1455. The master controller 1455 may therefore provide a laser position, direction, and timing correction signal, for example, to the laser control system 1457 that may be used, for example, to control the laser timing circuit and/or to the beam control system 1458 to control an amplified light beam position and shaping of the beam transport system 1420 to change the location and/or focal power of the beam focal spot within the chamber 1430.

The supply system 1425 includes a target material delivery control system 1426 that is operable, in response to a signal from the master controller 1455, for example, to modify the release point of the droplets as released by a target material supply apparatus 1427 to correct for errors in the droplets arriving at the desired plasma formation location 1405. The target material supply apparatus 1427 includes a target formation apparatus that employs an adhesive such as the adhesive 234.

Additionally, the light source 1400 may include light source detectors 1465 and 1470 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 1465 generates a feedback signal for use by the master controller 1455. The feedback signal may be, for example, indicative of the errors in parameters such as the timing and focus of the laser pulses to properly intercept the droplets in the right place and time for effective and efficient EUV light production.

The light source 1400 may also include a guide laser 1475 that may be used to align various sections of the light source 1400 or to assist in steering the amplified light beam 1410 to the plasma formation location 1405. In connection with the guide laser 1475, the light source 1400 includes a metrology system 1424 that is placed within the focus assembly 1422 to sample a portion of light from the guide laser 1475 and the amplified light beam 1410. In other implementations, the metrology system 1424 is placed within the beam transport system 1420. The metrology system 1424 may include an optical element that samples or re-directs a subset of the light, such optical element being made out of any material that may withstand the powers of the guide laser beam and the amplified light beam 1410. A beam analysis system is formed from the metrology system 1424 and the master controller 1455 since the master controller 1455 analyzes the sampled light from the guide laser 1475 and uses this information to adjust components within the focus assembly 1422 through the beam control system 1458.

Thus, in summary, the light source 1400 produces an amplified light beam 1410 that is directed along the beam path to irradiate the target mixture 1414 at the plasma formation location 1405 to convert the target material within the mixture 1414 into plasma that emits light in the EUV range. The amplified light beam 1410 operates at a particular wavelength (that is also referred to as a drive laser wavelength) that is determined based on the design and properties of the laser system 1415. Additionally, the amplified light beam 1410 may be a laser beam when the target material provides enough feedback back into the laser system 1415 to produce coherent laser light or if the drive laser system 1415 includes suitable optical feedback to form a laser cavity.

Figure 15:
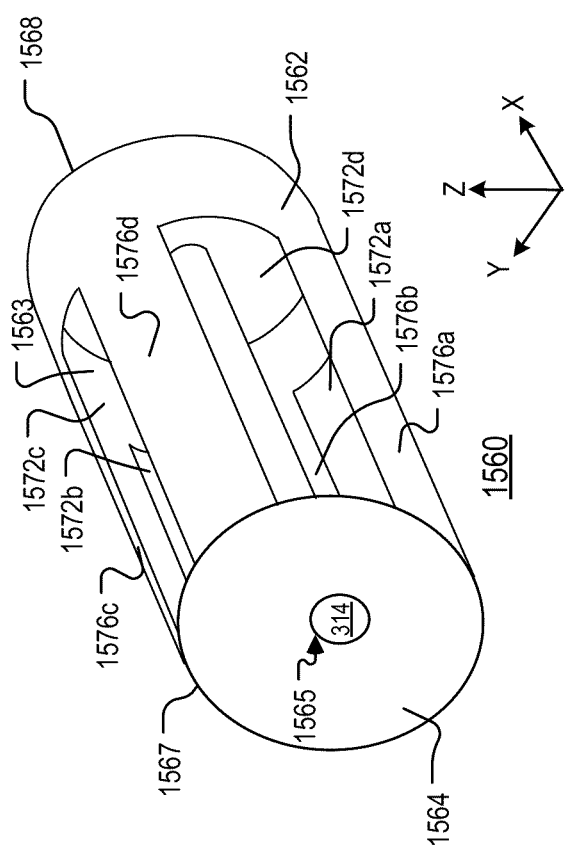

FIG. 15 is a perspective view of a support structure 1560. The support structure 1560 is an implementation of the support structure 360 (FIGS. 3A, 3B, and 3D) and the support structure 560 (FIG. 5). The support structure 1560 includes a first support portion 1562 and a second support portion 1564 that is connected to the first support portion 1562. The first support portion 1562 includes four prongs 1576a, 1576b, 1576c, 1576d. Each of the prongs 1576a, 1576b, 1576c, 1576d extends in the X direction from an end 1567 to an end 1568. The prongs 1576a, 1576b, 1576c, 1576d are spaced apart from each other about the end 1567 to define four respective openings 1572a, 1572b, 1572c, 1572d in the first support portion 1562. The openings 1572a, 1572b, 1572c, 1572d are in a side of the first support portion 1562 and extend along the X direction between the ends 1567 and 1568. The openings 1572a, 1572b, 1572c, 1572d may be the same or different sizes. The prongs 1576a, 1576b, 1576c, 1576d may be made of a rigid or a flexible material. The prongs 1576a, 1576b, 1576c, 1576d may include the same or different lengths in the circumferential direction. Moreover, the first support portion 1562 may include more or fewer than four prongs 1576a, 1576b, 1576c, 1576d. Furthermore, the first support portion 1562 may be a continuous sidewall that does not include any prongs or openings.

To assemble a nozzle apparatus that includes the support structure 1560, the support structure 1560 is attached to the end 357 of the body 350 (FIGS. 3A and 3C) to form a nozzle apparatus. Specifically, a portion of an inner surface 1563 of the end 1568 may be attached to the outer surface 356 of the first body wall 352 by, for example, an interference fit between the inner surface 1563 and the outer surface 356, an adhesive that bonds the outer surface 356 and the inner surface 1563, mechanical devices such as fasteners, a threaded interface, or any other means capable of holding the support structure 1560 to the body 350. When the nozzle apparatus is assembled, the capillary tube 314 passes through the openings 355 and 1565 such that the second support portion 1564 holds and supports the capillary tube 314 in the opening 1565 near the end 331 of the capillary tube 314.

The openings 1572a, 1572b, 1572c, 1572d of the first support portion 1562 allow for a partial view of the interior region within the support structure 1560. For example, the openings 1572a, 1572b, 1572c, 1572d allow the support structure 1560 to be attached to and aligned with the end 357 and the capillary tube 314 in a relatively straightforward and easy manner. Furthermore, the openings 1572a, 1572b, 1572c, 1572d allow for visual inspection of the support structure 1560 and its components. For example, the placement of the metal wire 1183 may be viewed through the openings 1572a, 1572b, 1572c, 1572d and an operator may easily check to determine whether the wire 1183 should be repositioned or otherwise adjusted.

Other aspects of the invention are set out in the following numbered clauses.

1. An apparatus comprising:
a tube comprising an inner width, and an opening at an end, wherein the inner width is between 0.1 millimeters (mm) and 0.8 mm, and the opening has a width between 1.0 micrometer (m) and 5.0 µm;
an electro-mechanical actuator in contact with the tube and configured to impart mechanical motion into the tube, wherein the mechanical motion includes at least a first frequency component between 40 kilohertz (kHz) and 100 kHz and a second frequency component having a higher frequency than the first frequency component;
a body comprising: a first body wall and a second body wall, wherein the first body wall extends in a first direction, the second body wall extends in a second direction that is different than the first direction, and a first portion of the tube passes through an opening in the second body wall, wherein an interior of the tube and an interior of the body are configured to receive molten target material, and the target material emits extreme ultraviolet (EUV) light when in a plasma state; and
a support structure comprising: a first support portion and a second support portion, wherein the first support portion is configured to attach to the first body wall and a second portion of the tube is configured to pass through the second support portion when the first support portion is attached to the first body wall.

2. The apparatus of clause 1, wherein the second support portion is an end wall that defines a support opening and, the second portion of the tube is configured to pass through the support opening when the first support portion is attached to the first body wall.

3. The apparatus of clause 2, wherein the support opening comprises a chamfered opening, and, when the first support portion is attached to the first body wall, an exterior surface of the second portion of the tube is captured by the chamfered opening.

4. The apparatus of clause 2, wherein the second support portion further comprises an adjustment mechanism configured to control mechanical coupling between the tube and the second support portion.

5. The apparatus of clause 4, wherein the first support portion extends from a first end that is configured to attach to the first body wall, and the first support portion comprises a plurality of segments that extend from the first end, the plurality of segments comprising a rigid prong and at least one flexible prong.

6. The apparatus of clause 5, wherein the adjustment mechanism passes through the rigid prong, and the adjustment mechanism is configured to position the second support portion to thereby control mechanical coupling between the tube and the second support portion.

7. The apparatus of clause 5, wherein an opening is between each of the plurality of segments.

8. The apparatus of clause 4, wherein the adjustment mechanism is in physical contact with the first support portion and the end wall, and the adjustment mechanism moves the end wall to control the mechanical coupling between the tube and the second support.

9. The apparatus of clause 2, wherein the end wall comprises a first material, and the apparatus further comprises a ferrule of a second material that surrounds the support opening, and the second material is softer than the first material.

10. The apparatus of clause 9, wherein the first material comprises a metal, and the second material comprises a polymer.

11. The apparatus of clause 10, wherein the polymer comprises polyimide resins, polyetheretherketone, polybenzimidazole resins, or Teflon.

12. The apparatus of clause 11, wherein the first material comprises a metal, and the second material comprises an adhesive material.

13. The apparatus of clause 12, wherein the adhesive material comprises bismaleimide resin or a cyanate ester based resin.

14. The apparatus of clause 2, further comprising a potting compound, and wherein, when the first support portion is attached to the first body wall, the first support portion and the end wall define an interior support region that contains the potting compound.

15. The apparatus of clause 14, wherein the tube passes through the support opening in the second support portion, and the second support portion is not in mechanical contact with the tube.

16. The apparatus of clause 15, wherein the second support portion is configured to protect the potting compound from EUV light emitted from the plasma formed from the target material.

17. The apparatus of clause 14, wherein the potting compound does not completely fill the interior support region.

18. The apparatus of clause 17, wherein the potting compound occupies a first part of the interior support region that is closer to the body than to the end wall, and a second part of the interior support region that is closer to the end wall than the body does not include any potting compound.

19. The apparatus of clause 18, wherein the potting compound comprises an adhesive.

20. The apparatus of clause 19, wherein the adhesive comprises at least one of a bismaleimide-based adhesive, a benzoxazine-based adhesive, a cyanate ester based adhesive, a room-temperature-vulcanizing (RTV) adhesive, or a high temperature epoxy adhesive.

21. The apparatus of clause 1, wherein the first support portion comprises a rigid material.

22. The apparatus of clause 1, wherein the first support portion comprises a metal.

23. The apparatus of clause 1, wherein the first support portion comprises a flexible material.

24. The apparatus of clause 1, wherein the support structure is between the body and the electro-mechanical actuator.

25. The apparatus of clause 1, wherein, when the first support portion is attached to the first body wall, the electro-mechanical actuator is surrounded by the first support portion.

26. The apparatus of clause 1, wherein the first support portion is configured to attach to an exterior of the first body wall.

27. The apparatus of clause 1, wherein the second frequency component is a harmonic of the first frequency component or a harmonic of another frequency applied to the tube by the electro-mechanical actuator.

28. The apparatus of clause 1, wherein the first support portion comprises one or more openings that extend along a side of the first support portion between a first end of the first support portion and a second end of the first support portion.

29. An apparatus comprising:
a tube;
a body comprising: a first body wall and a second body wall, wherein the first body wall extends in a first direction, the second body wall extends in a second direction that is different than the first direction, and a first portion of the tube passes through an opening in the second body wall; and
a support structure comprising: a first support portion and a second support portion, wherein the first support portion is configured to attach to the first body wall, and, when the first support portion is attached to the first body wall, a second portion of the tube passes through the second support portion.

30. An apparatus for an extreme ultraviolet light source, the apparatus comprising:
a tube comprising a side wall having a length that extends from a first end to a second end; an actuator mechanically coupled to an exterior of the side wall;
a body comprising: a first body wall, and a second body wall; and
a fitting disposed at an end of the body, the fitting comprising a passage, wherein a first portion of the side wall is held at an opening in the second body wall, a second portion of the side wall is disposed in the passage, the actuator is between the fitting and the second end of the tube, and approximately half of the length of the side wall is surrounded by the body.

31. The apparatus of clause 30, wherein more than half of the length of the side wall is surrounded by the body.

32. An apparatus for an extreme ultraviolet light (EUV) source, the apparatus comprising:
a tube comprising a side wall that extends from a first end to a second end;
an actuator mechanically coupled to an exterior of the side wall;
a body comprising: a first body wall, and a second body wall; and
a fitting disposed at an end of the body, the fitting comprising a passage and a ferrule, wherein a portion of the side wall is in the passage, and the ferrule is between the portion of the side wall and the fitting.

33. The apparatus of clause 32, further comprising a metal wire with a layer of polymer material connected to the fitting and encircling an exterior of the side wall, the wire configured to reduce vibration of the tube.

34. The apparatus of clause 33, wherein the layer of polymer material forms a coating on the metal wire.

35. The apparatus of clause 33, further comprising a support structure, the support structure comprising: a first support portion and a second support portion, wherein the first support portion is configured to attach to the first body wall, and, when the first support portion is attached to the first body wall, the tube passes through the second support portion.

36. The apparatus of clause 35, wherein the second support portion is configured to protect the layer of polymer from plasma in the EUV light source.

37. The apparatus of clause 36, wherein the second support portion is not in mechanical contact with the tube.

38. The apparatus of clause 32, wherein the ferrule extends beyond the fitting.

39. A support structure for a target material supply system, the support structure comprising:
a first support portion; and a second support portion, wherein the first support portion is configured to attach to a first body wall of the target material supply system, and, when the first support portion is attached to the first body wall, a tube of the target material supply system passes through the second support portion.

40. The support structure of clause 39, wherein the target material supply system is configured to be coupled to a vacuum chamber of an extreme ultraviolet light source.

The above described implementations and other implementations are within the scope of the claims.

What is claimed is:

1. An apparatus for an extreme ultraviolet light source, the apparatus comprising:
    a tube comprising a side wall having a length that extends from a first end to a second end;
    an actuator mechanically coupled to an exterior of the side wall;
    a body comprising: a first body wall, and a second body wall; and
    a fitting disposed at an end of the body, the fitting comprising a passage, wherein a first portion of the side wall is held at an opening in the second body wall, a second portion of the side wall is disposed in the passage, the actuator is between the fitting and the second end of the tube, and at least half of the length of the side wall is surrounded by the first body wall in an interior region configured to be fluidly coupled to a reservoir of target material.

2. The apparatus of claim 1, wherein more than half of the length of the side wall is surrounded by the first body wall.

3. The apparatus of claim 1, wherein the fitting further comprises a ferrule.

4. The apparatus of claim 3, further comprising a polymer coated metal wire that encircles an exterior of the side wall and is configured to reduce vibration of the tube.

5. The apparatus of claim 4, wherein the polymer coated metal wire encircles an exterior of the side wall between the ferrule and the actuator.

6. The apparatus of claim 3, wherein the ferrule extends beyond the fitting.

7. The apparatus of claim 1, wherein an outer diameter of the side wall is between about 1.5 millimeters (mm) and about 5.0 mm, and wherein a radial thickness of the side wall between an outer portion of the side wall and an inner portion of the side wall is between about 0.35 mm and about 2.0 mm.

8. The apparatus of claim 1, wherein the second body wall is perpendicular to the first body wall.

9. The apparatus of claim 1, wherein the first body wall and the second body wall at least partially define the interior region.

10. An apparatus for an extreme ultraviolet light (EUV) source, the apparatus comprising:
    a tube comprising a side wall that extends from a first end to a second end;
    an actuator mechanically coupled to an exterior of the side wall;
    a body comprising: a first body wall, and a second body wall; and
    a fitting disposed at an end of the body, the fitting comprising a passage and a ferrule, wherein a portion of the side wall is in the passage of the fitting, and a portion of the ferrule is between the portion of the side wall and the fitting.

11. The apparatus of claim 10, further comprising a metal wire with a layer of polymer material connected to the fitting and encircling an exterior of the side wall, the metal wire configured to reduce vibration of the tube.

12. The apparatus of claim 11, further comprising a support structure, the support structure comprising: a first support portion and a second support portion, wherein the first support portion is configured to attach to the first body wall, and, when the first support portion is attached to the first body wall, the tube passes through the second support portion.

13. The apparatus of claim 12, wherein the second support portion is configured to protect the layer of polymer from plasma in the EUV light source.

14. The apparatus of claim 12, further comprising a potting compound, wherein, when the first support portion is attached to the first body wall, the potting compound is in an interior support region partially defined by the second support portion.

15. The apparatus of claim 14, wherein the potting compound does not completely fill the interior support region.

16. The apparatus of claim 14, wherein the potting compound comprises an adhesive.

17. The apparatus of claim 11, wherein the metal wire encircles the exterior of the side wall between the ferrule and the actuator.

18. The apparatus of claim 10, wherein the ferrule extends beyond the fitting.

19. The apparatus of claim 10, wherein the side wall extends through the ferrule such that one of the first end and the second end extends beyond the ferrule.

20. The apparatus of claim 10, wherein the ferrule is rigidly attached to the fitting.

21. The apparatus of claim 10, further comprising a support structure, the support structure comprising: a first support portion and a second support portion, wherein the first support portion is configured to attach to the first body wall, and, when the first support portion is attached to the first body wall, the tube passes through the second support portion.

* * * * *